United States Patent
Moriwaki et al.

(10) Patent No.: US 7,630,286 B2
(45) Date of Patent: Dec. 8, 2009

(54) DIGITAL PLL CIRCUIT AND OPTICAL DISK APPARATUS HAVING DIGITAL PLL CIRCUIT

(75) Inventors: Isamu Moriwaki, Osaka (JP); Toshihiro Shigemori, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 504 days.

(21) Appl. No.: 11/652,679

(22) Filed: Jan. 12, 2007

(65) Prior Publication Data

US 2007/0172014 A1 Jul. 26, 2007

(30) Foreign Application Priority Data

Jan. 16, 2006 (JP) .............................. 2006-007462

(51) Int. Cl.
*G11B 20/10* (2006.01)
(52) U.S. Cl. .................................. 369/59.2; 369/59.19
(58) Field of Classification Search ............... 369/59.19
See application file for complete search history.

(56) References Cited

U.S. PATENT DOCUMENTS

| 2003/0016600 A1* | 1/2003 | Hiratsuka | 369/44.34 |
| 2004/0027940 A1* | 2/2004 | Minamino et al. | 369/47.3 |
| 2005/0128903 A1* | 6/2005 | Ma et al. | 369/44.41 |

FOREIGN PATENT DOCUMENTS

| JP | 60-245312 | 12/1985 |
| JP | 63-155824 | 6/1988 |
| JP | 08-274628 | 10/1996 |
| JP | 2003-209468 | 7/2003 |

* cited by examiner

*Primary Examiner*—Paul Huber
(74) *Attorney, Agent, or Firm*—Dickstein Shapiro LLP

(57) ABSTRACT

An optical disk apparatus includes a binarizing circuit part for outputting a reference digital signal, and a digital PLL circuit part for outputting a write timing signal based on the reference digital signal, the write timing signal indicating a timing synchronizing with a digital clock signal having a predetermined frequency. The digital PLL circuit part includes an edge detection circuit part for detecting a rise edge and a fall edge of the reference digital signal in time resolution units in which a single period of a reference clock signal is divided into N (N where is no less than 2) intervals and outputting an edge detection signal for each the single period in accordance with the detection result, a digital clock data generating part for generating digital clock data in accordance with a phase difference indicated in an input phase difference signal in each the single period, and a phase difference detection circuit part for detecting a phase difference between the reference digital clock signal and the digital clock signal and outputting the phase difference signal indicating the detected phase difference.

20 Claims, 15 Drawing Sheets

DIGITAL PLL CIRCUIT AND OPTICAL DISK APPARATUS HAVING DIGITAL PLL CIRCUIT

BACKGROUND OF THE INVENTION

1. Field of the Invention

The present invention relates to a digital PLL (Phase Lock Loop) circuit and an optical disk apparatus having the digital PLL circuit.

2. Description of the Related Art

In recordable optical disks (e.g. CD-R/RW, DVD+R/RW, and DVD-R/RW), physical address data are embedded beforehand in a meandering groove referred to as a wobble. The wobble is formed in a groove track forming process in which the track is formed in a manner wobbling in a radial direction. The physical address data are expressed in various modulation methods (e.g. frequency modulation used for CD-R/RW, phase modulation used for DVD+R/RW, modulation of discontinuous points of a wobble used for DVD-R/Rw). The carrier frequency of a wobble is set in proportion to the frequency of a reference clock signal for writing (writing reference clock signal).

The writing reference clock signal is generated by a PLL (Phase Lock Loop) circuit, in which the frequency of the wobble signal obtained from the above-described wobble (hereinafter referred to as "wobble frequency") is used as a comparison frequency. In generating a writing reference clock signal with a PLL circuit having the wobble frequency as the comparative frequency, it is essential to generate a clock signal with steady low jitter.

The PLL is realized by an analog circuit having a VCO (Voltage Controlled Oscillator). Since the free running frequency of the analog VCO tends to change due to changes in atmospheric temperature and power supply voltage, the acquisition time of the PLL circuit tends to become long and its lock tends to dislocate due to disturbance. Therefore, in recent years, there has developed a demand for a digital PLL (DPLL: Digital PLL) that is fully digitized.

For example, a DPLL circuit according to a related art case is provided with an integration circuit for integrating output signals of a phase comparator in which signals output from the integration circuit and the phase comparator are time-divisionally switched and added to a loop filter (for example, see Japanese Laid-Open Patent Application No. 60-245312).

In another exemplary DPLL circuit according to a related art case, after detecting the phase difference between low time resolution oscillation clock signals and desired high time resolution clock signals, the output signals of the digital VCO are phase-modulated based on the phase difference information and are supplied to a frequency band controlling part of the next step so that only the basic frequency components are output (for example, see Japanese Laid-Open Patent Application No. 2003-209468).

Furthermore, in another exemplary DPLL circuit according to a related art case, there is provided a sequential loop filter having p (p where is an integer no less than 2) steps (hereinafter referred to as "p step sequential loop filter") that integrates with different phases, a multi-phase clock generating circuit that provides p phase clock signals of different phases to the p step sequential loop filter, an adder that adds p integration signals output from the p step sequential loop filter and provides the signals to a variable divider, and a selecting circuit that selects an optimum clock signal from the multi-phase clock signals and outputs the selected signal (for example, see Japanese Laid-Open Patent Application No. 8-274628).

Furthermore, in an exemplary DPLL filter according to a related art case, there is provided a counter that counts the phase difference between input signals and output signals and outputs the counted value and an integrator that integrates the counted value with a predetermined value as a slope in the period of the clock signals and outputs an overflow (size error) signal whenever an overflow (size error) occurs (For example, see Japanese Laid-Open Patent Application No. 63-155824).

However, with the above-described DPLL circuit, the clock signals for operations inside the DPLL circuit (operating clock signals) are required to be high frequency clock signals in a case of increasing the time resolution of the clock signals output from the DPLL circuit. That is, since the recording speed and reproducing speed of CD drives and DVD drives have remarkably increased in recent years, there is a need to significantly increase the frequency of the operating clock signals inside the DPLL circuit. When the frequency of the operating clock signals is increased to such an extent, the operating frequency of the circuit exceeds its limit and causes the DPLL circuit to be inoperative.

Furthermore, although the above-described DPLL circuit may be provided with a VCO which outputs clock signals having high time resolution by using a digital circuit operating at a relatively low frequency, such a DPLL circuit requires a frequency bandwidth controlling part for the next step such as an analog PLL circuit or an analog band pass filter. However, with such a configuration, the DPLL circuit cannot be a fully digitized circuit. Therefore, in a case of attempting to integrate such a DPLL circuit into a single IC (integrated chip), the IC becomes a mixed signal IC having mixed analog and digital circuits. This complicates the manufacturing process and increases manufacturing cost.

Furthermore, with the above-described DPLL circuit, it is necessary to operate complicated logic circuits (e.g. sequential loop filter, variable divider) each with multi-phase clocks having different phase differences. It is therefore difficult to use the synchronous design methods used for digital circuits. Furthermore, the above-described DPLL circuit is basically configured to add one pulse when a phase is early and to subtract one pulse when a phase is delayed in accordance with the detection result of the phase difference between input signals and output signals. Therefore, with the above-described DPLL circuit, it is difficult to freely change characteristics (settings) such as response characteristics or loop bandwidth. As a result, designing the DPLL circuit becomes difficult.

SUMMARY OF THE INVENTION

The present invention may provide a digital PLL circuit and an optical disk apparatus having the digital PLL circuit that substantially obviate one or more of the problems caused by the limitations and disadvantages of the related art.

Features and advantages of the present invention are set forth in the description which follows, and in part will become apparent from the description and the accompanying drawings, or may be learned by practice of the invention according to the teachings provided in the description. Objects as well as other features and advantages of the present invention will be realized and attained by a digital PLL circuit and an optical disk apparatus having the digital PLL circuit particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides an optical disk apparatus including a binarizing circuit part for outputting a reference digital signal; and a digital PLL circuit part for outputting a write timing signal based on the reference digital signal, the write timing signal indicating a timing synchronizing with a digital clock signal having a predetermined frequency; wherein the digital PLL circuit part includes an edge detection circuit part for detecting a rise edge and a fall edge of the reference digital signal in time resolution units in which a single period of a reference clock signal is divided into N (N where is no less than 2) intervals and outputting an edge detection signal for each the single period in accordance with the detection result, a digital clock data generating part for generating digital clock data in accordance with a phase difference indicated in an input phase difference signal in each the single period, and a phase difference detection circuit part for detecting a phase difference between the reference digital clock signal and the digital clock signal and outputting the phase difference signal indicating the detected phase difference.

Furthermore, another embodiment according to the present invention provides a digital PLL circuit for outputting a write timing signal based on an input reference digital signal, the write timing signal indicating a timing synchronizing with a digital clock signal having a predetermined frequency, the digital PLL circuit including an edge detection circuit part for detecting a rise edge and a fall edge of the reference digital signal in time resolution units in which a single period of a reference clock signal is divided into N (N where is no less than 2) intervals and outputting an edge detection signal for each the single period in accordance with the detection result; a digital clock data generating part for generating digital clock data in accordance with a phase difference indicated in an input phase difference signal in each the single period; and a phase difference detection circuit part for detecting a phase difference between the reference digital clock signal and the digital clock signal and outputting the phase difference signal indicating the detected phase difference; wherein the edge detection circuit part includes a sampling circuit part for sampling the reference digital signal with N phase clock signals of different phases in the time resolution units, a bit data addition circuit part adding each bit data item in a N bit data set obtained from the sampling in each the single period and outputting bit addition data indicating the addition results, and a zero-crossing detecting circuit part for detecting a zero-crossing point of bit addition data signals including the bit addition data in the time resolution units and outputting the detection results as the edge detection signal in each the single period.

Other objects and further features of the present invention will be apparent from the following detailed description when read in conjunction with the accompanying drawings.

DESCRIPTION OF THE PREFERRED EMBODIMENTS

In the following, embodiments of the present invention are described with reference to the accompanying drawings.

First Embodiment

Figure 1:
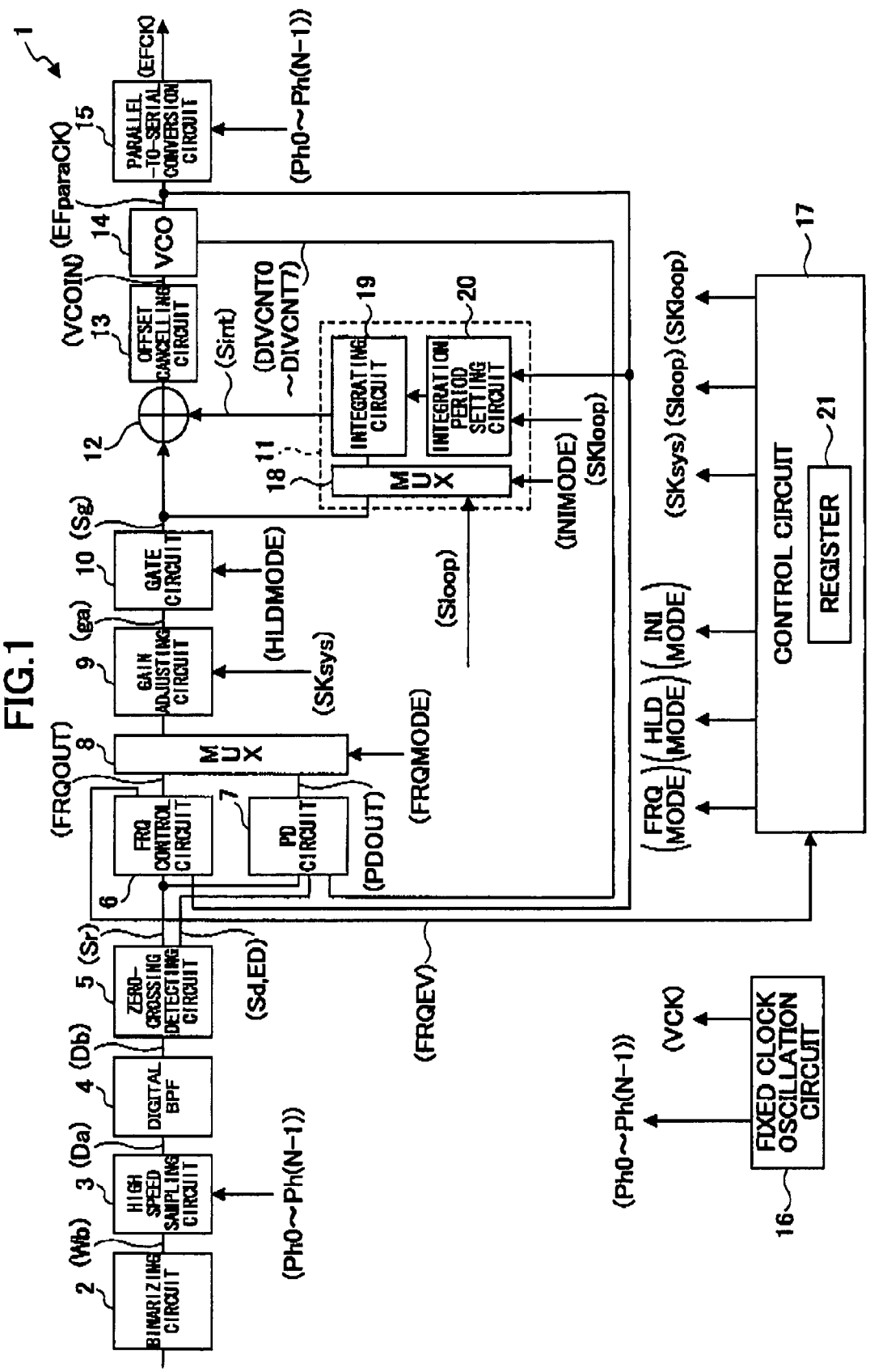
FIG. 1 is a block diagram showing an exemplary configuration of a digital PLL circuit according to an embodiment of the present invention.

FIG. 1 is a block diagram showing an exemplary configuration of a digital PLL circuit according to a first embodiment of the present invention. As shown in FIG. 1, an optical disk apparatus 1 having the digital PLL circuit includes, for example, a binarizing circuit 2, a high speed sampling circuit 3, a digital band pass filter (hereinafter referred to as "digital BPF") 4, a zero-crossing detecting circuit 5, a frequency control circuit (hereinafter referred to as "FRQ control circuit") 6, a phase comparing circuit (hereinafter referred to as "PD circuit") 7, a multiplexer (hereinafter referred to as "MUX") 8, a gain adjusting circuit 9, a gate circuit 10, a loop bandwidth setting circuit 11, an adder 12, an offset canceling circuit 13, a VCO 14, a parallel-to-serial conversion circuit 15, a fixed clock oscillation circuit 16, and a control circuit 17. The loop bandwidth setting circuit 11 includes, for example, a MUX 18, an integrating circuit 19, and an integration period setting circuit 20. Furthermore, the control circuit 17 includes, for example, a register 21. The control circuit 17 outputs three control signals (FRQMODE signal, HLDMODE signal, INIMODE signal) and a SKsys signal, a Sloop signal, and a SKloop signal each indicative of a constant. The constants indicated by the SKsys signal, the Sloop signal, and the SKloop signal are stored in the register 21. Furthermore, the fixed clock oscillation circuit 16 outputs a fixed clock signal (reference clock signal) VCK and N (N where is an integer no less than 2) phase clock signals Ph0 through Ph(N−1). Except for the high speed sampling circuit 3 and the parallel-to-serial conversion circuit 15, each of the above-described elements included in the optical disk apparatus 1 operates in accordance with the fixed clock signal VCK. It is to be noted that the high speed sampling circuit 3, the digital BPF 4, and the zero-crossing detecting circuit 5 serve as an edge detection circuit part, and the digital BPF 4 and the zero-crossing detecting circuit 5 serve as a zero-crossing detection circuit part. Furthermore, the PD circuit 7 serves as a phase difference detection circuit part. The VCO 14 serves as a clock data generation circuit part. Furthermore, the FRQ control circuit 6, the MUX 8, the gain adjusting circuit 9, and the gate circuit 10 serve as a frequency difference detection circuit part, first (second) selection circuit part, a gain adjustment circuit part, and a gate circuit part, respectively. The loop bandwidth setting part 11 serves as an integration circuit part. The adder 12 serves as a first addition circuit part. Furthermore, the parallel-to-serial conversion circuit 15 serves as a parallel-to-serial conversion circuit part. Among the above-described elements included in the optical disk apparatus 1, the elements except for the binarizing circuit 2 compose a digital PLL circuit. Furthermore, the FRQMODE signal, the INMODE signal, and the HLDMODE signal correspond to a first control signal, a second control signal, and a third control signal, respectively. The Sloop signal and the SKsys signal correspond to a first predetermined signal and a second predetermined signal, respectively.

Next, an operation of the optical disk apparatus 1 is described. First, the binarizing circuit 2 generates a wobble signal Wb by binarizing a signal reproduced from an optical disk and outputs the generated wobble signal Wb. The high speed sampling circuit 3 samples the input wobble signal Wb with N phase clock signals in which the period of each phase is T and the phase difference of the phases is T/N. The high speed sampling circuit 3 generates N bit data items for each single period T of the fixed clock signal VCK and adds the bit data of the N bit data items, to thereby output a bit addition data set according to the addition results. Hereinafter, a signal including each of the bit addition data sets is referred to as a data signal Da.

The digital BPF 4 filters the input data signal Da, to thereby output data signal Db. The zero-crossing detecting circuit 5 detects the zero-crossing point of the input digital signal Db. More specifically, the zero-crossing detecting circuit 5 detects the zero-crossing point of the data signal Db in time resolution units in which a single period of the fixed clock signal VCK is divided into N intervals (N parts). Then, N bits of zero-crossing detection signals ED, which are indicative of the detection results, are output from the zero-crossing detecting circuit 5 for each single period T. In this example, the zero-crossing detecting circuit 5 determines that the point when the value of the data signal Db changes from negative to positive is the zero-crossing point of the edge of the rise. The zero-crossing detecting circuit 5 determines that the point when the value of the data signal Db changes from positive to negative is the zero-crossing point of the edge of the fall. In accordance with the determination results, the zero-crossing detecting circuit 5 outputs a rise detection signal Sr and a fall detection signal Sd. Accordingly, with this operation, the zero-crossing detection circuit 5 detects the edge of the rise of the wobble signal Wb and the edge of the fall of the wobble signal Wb. The FRQ control circuit 6 detects the frequency difference between the wobble signal Wb and the write reference clock signal according to the input rise detection signal Sr and the output signal EFparaCK of the VCO 14. In this example, the output signal EFparaCK of the VCO 14 is as an edge position signal indicating whether there is an edge of the rise or the fall of the writing reference clock signal in time resolution units T/N. In the below-described exemplary case, the edge position signal EFparaCK is described as indicating whether there is an edge of the rise of the writing reference clock signal in time resolution units T/N. Furthermore, the edge position signal also serves as a write timing signal. In a case where the above-described frequency difference is within a predetermined range, the FRQ control circuit 6 outputs a predetermined signal FRQEV to the control circuit 17. In a case where the above-described frequency difference is out of the predetermined range, the FRQ control circuit 6 outputs a frequency difference signal FRQOUT to the MUX 8. The PD circuit 7 detects the phase difference between the wobble signal Wb and the writing reference clock signal according to the zero-crossing detections signals ED output from the zero-crossing detecting circuit 5 and respective clock data DIVCNT 0 through DIVCNT 7 output from the VCO 14. Then, the PD circuit 7 outputs a phase detection signal PDOUT in accordance with the detection results.

In accordance with the control signal FRQMODE output from the control circuit 17, the MUX 8 selects either the frequency difference signal FRQOUT or the phase difference signal PDOUT and outputs the selected signal. The control circuit 17 changes the control signal FRQMODE depending on whether the predetermined signal FRQEV is output from the FRQ control circuit 6. As a result, the MUX 8 outputs the phase difference signal PDOUT only when the frequency difference between the wobble signal Wb and the writing reference clock signal is within a predetermined range. This allows the optical disk apparatus 1 to first perform frequency acquisition and then shift to phase acquisition.

The output signal of the MUX 8, after having its gain adjusted by the gain adjusting circuit 9, is input as a signal ga (ga signal) to the gate circuit 10. In accordance with the control signal HLDMODE input from the control circuit 17, the gate circuit 10 either simply outputs the signal ga input from the gain adjusting circuit 9 or refrains from outputting the signal ga. Such function of the gate circuit 10 can be used to, for example, invalidate the above-described phase comparison results when a scratch or a defect is detected on the optical disk.

The loop bandwidth setting circuit 11 integrates an output signal Sg of the gate circuit 10 in correspondence with the period of the writing reference clock signal and outputs a signal Sint. The adder 12 adds the output signal Sg of the gate circuit 10 and the output signal Sint of the loop bandwidth setting circuit 11 and outputs the addition result to the offset canceling circuit 13. The offset canceling circuit 13 serves to cancel the offset performed in the zero-crossing detecting circuit 5.

Then, an output signal VCOIN of the offset canceling circuit 13 is input to the VCO 14. In accordance with the input VCOIN signal, the VCo 14 generates edge position signals EFparaCK of N bits for each period T and outputs the generated edge position signals EFparaCK to the parallel-to-serial conversion circuit 15. The parallel-to-serial conversion circuit 15 converts the edge position clock signals EFparaCK (which are parallel signals) to serial clock signals EFCK by using N phase clock signals Ph0 through PhN and outputs the converted serial clock signals EFCK.

Figure 2:
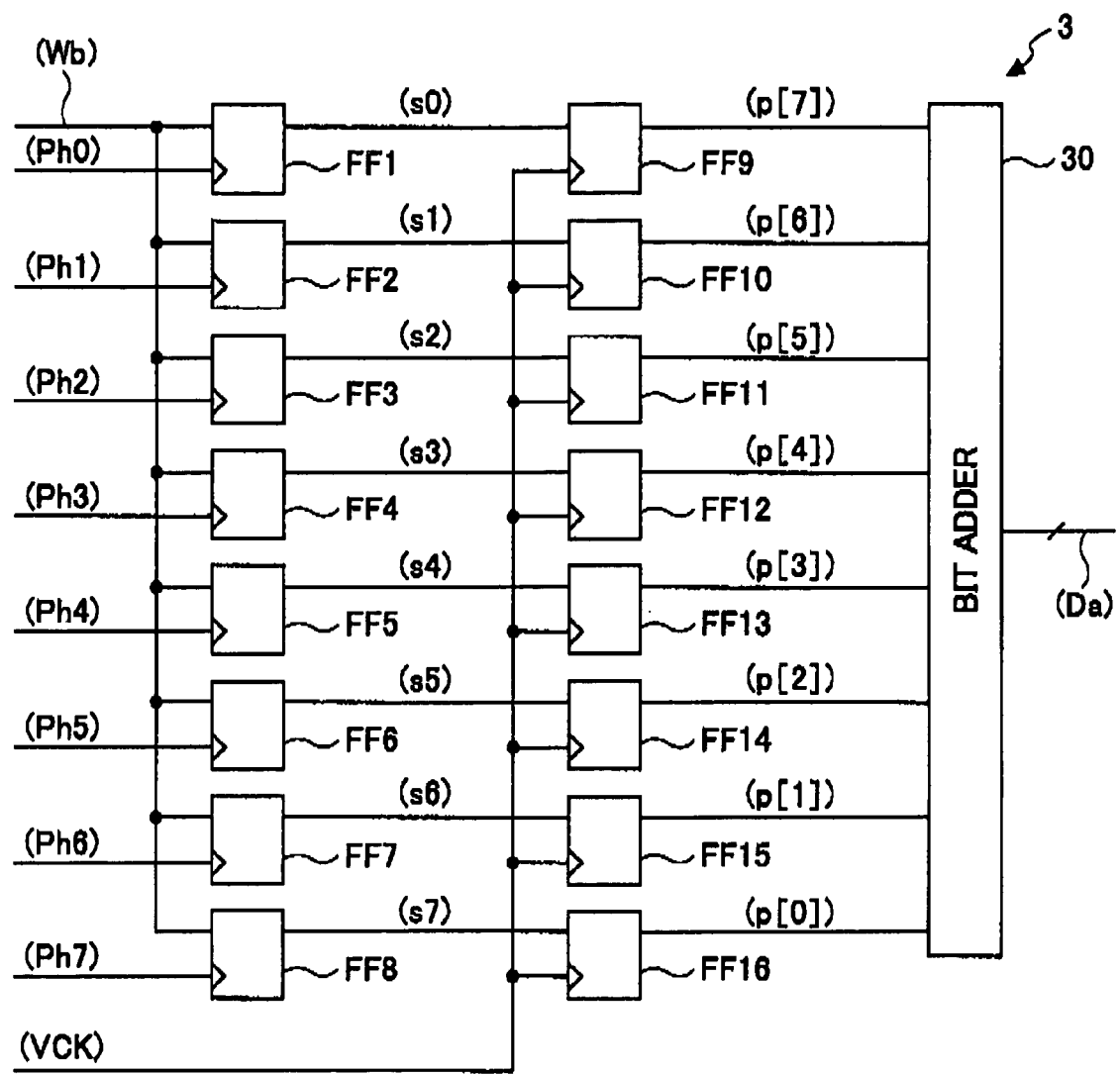
FIG. 2 is a circuit diagram showing an exemplary configuration of a high speed sampling circuit according to an embodiment of the present invention.

Next, the elements included in the optical disk apparatus 1 according to an embodiment of the present invention are described in further detail by using an exemplary case where N=8. Since a typical circuit may be the binarizing circuit 2, the following exemplary case is described starting from the high speed sampling circuit 3. FIG. 2 is a circuit diagram showing an exemplary configuration of a high speed sampling circuit 3 according to an embodiment of the present invention. As shown in FIG. 2, the high speed sampling circuit 3 includes, for example, 16 D-flip-flops FF1 through FF16 and a bit adder 30. Binarized wobble signals Wb binarized by the binarizing circuit 2 and corresponding clock signals Ph0 through Ph7 from the fixed clock oscillation circuit 16 are input to each D-flip-flop FF1 through FF8. Furthermore, output signals s0 through s7 output from corresponding D-flip-flops FF1 through FF8 and the fixed clock signal VCK output from the fixed clock oscillation circuit 16 are input to corresponding D-flip-flops FF9 through FF16. In this example, the fixed clock signal VCK and the clock signal Ph0 have the same frequency and phase. The signals p[7] through p[0] output from corresponding D-flip-flops FF9 through FF16 are input to the bit adder 30. The bit adder 30 adds each bit data set of the N bit data sets including signals p[7] through p[0]. It is to be noted that the D-flip-flops FF1 through FF16 serve as a sampling circuit part and the bit adder 30 serves as a bit data addition circuit part.

Figure 3:
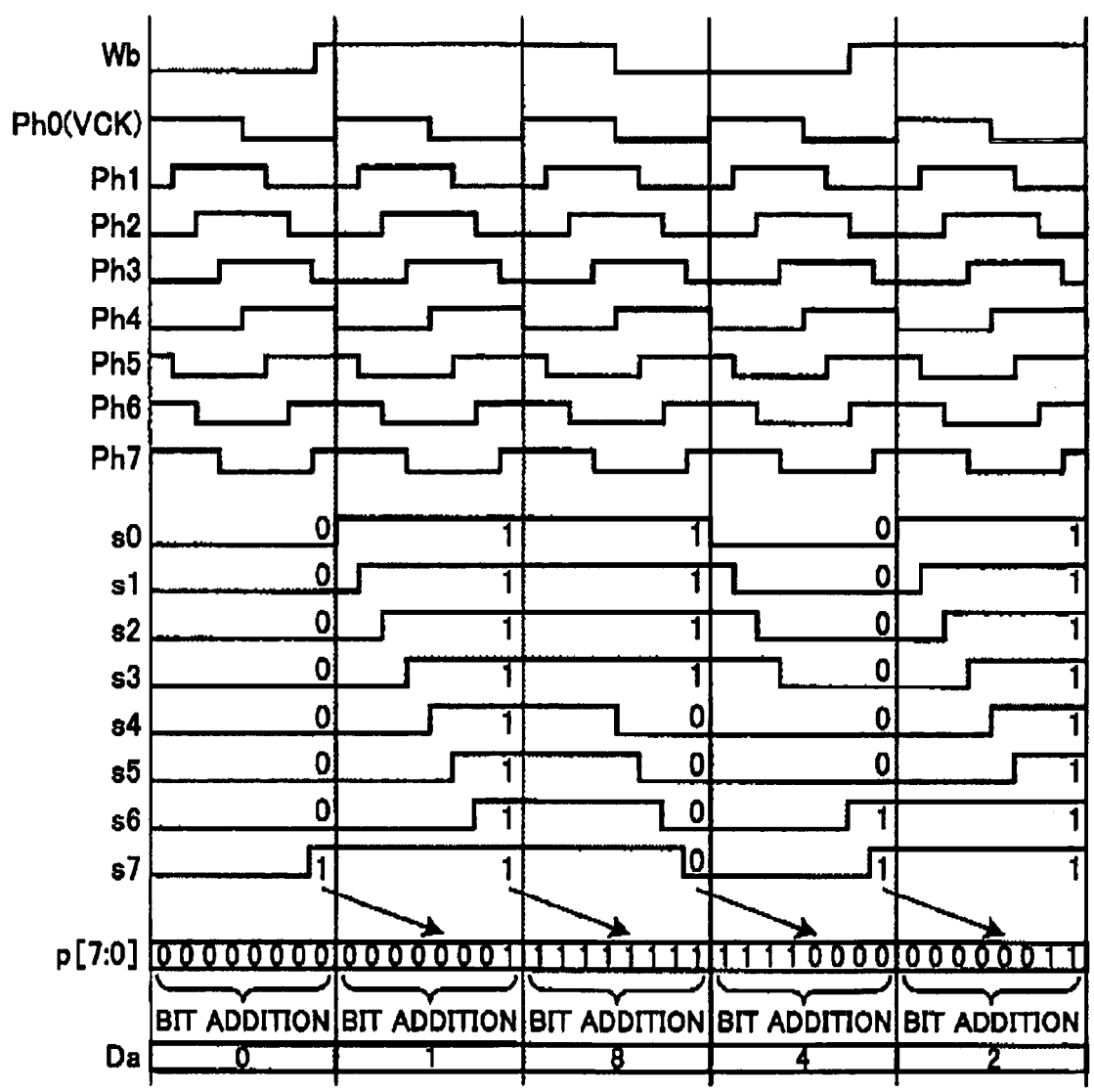
FIG. 3 is a schematic diagram showing an exemplary operation of a high speed sampling circuit according to an embodiment of the present invention.

FIG. 3 is a timing chart showing an exemplary operation of the high speed sampling circuit shown in FIG. 2. As shown in FIG. 3, the wobble signal Wb is sampled by. eight phase clock signals Ph0 through Ph7 in which the period of each phase is T and the phase difference between phases is T/8. Each signal s0 through s7 obtained by sampling the wobble signal Wb is input to the corresponding flip-flop FF9 through FF 16. The output signals p[7] through p[0] of the D-flip-flops FF9 through FF16 form 8 bit width parallel data p[7:0]. The bit adder 30 adds each the bit data of the parallel data p[7:0] and outputs the results of the addition. Accordingly, the bit adder 30 can output a value in proportion to the number of the bit data (bit data items), that is, a value in proportion to the period when the wobble signal Wb is maintained at H (high) level for each period T. It is to be noted that, although the bit adder 30 in this example simply outputs the results of adding each the bit data of the parallel data p[7:0], the bit adder 30 may further apply a moving average method on the addition results and output the moving average results.

As shown in FIG. 1, the data signal Da output from the high speed sampling circuit 3 is filtered by the narrow band digital BPF 4, to thereby become the data signal Db having noise components removed therefrom. Then, the data signal Db is input to the zero-crossing detecting circuit 5. It is to be noted that, in the optical disk apparatus 1 according to an embodiment of the present invention, only a fundamental frequency component of the wobble signal Wb will be extracted since the digital BPF 4 allows only a predetermined frequency band to pass therethrough. Accordingly, a DPLL circuit having more satisfactory characteristics can be achieved.

Figure 4:
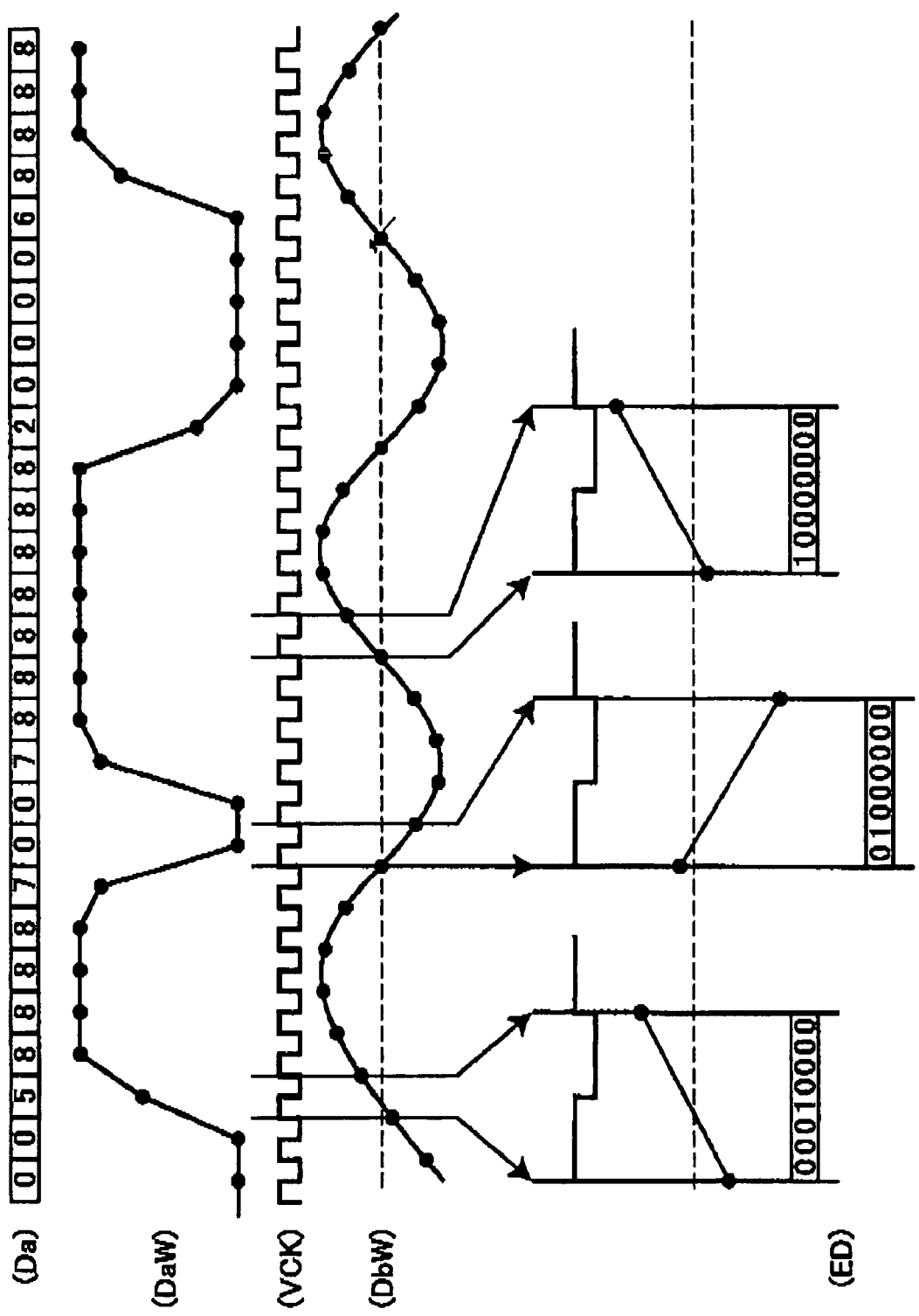
FIG. 4 is a schematic diagram for describing operations of a digital BPF and a zero cross detection circuit according to an embodiment of the present invention.

FIG. 4 is a schematic diagram for describing operations of the digital BPF 4 and the zero-crossing detecting circuit 5 according to an embodiment of the present invention. In order to make understanding of the operations of the digital BPF 4 and the zero-crossing-detecting circuit 5 easier, each data signal Da, Db output from the corresponding digital BPF 4 and the zero-crossing detecting circuit 5 are expressed with analog signal waveforms DaW, DbW, respectively. As shown in FIG. 4, the digital BPF 4 filters an input waveform DaW and outputs a filtered waveform DbW. Furthermore, the zero-crossing-detecting circuit 5 detects the zero-crossing point of the waveform DbW output from the digital BPF 4 in time resolution units of T/8.

Figure 5A:
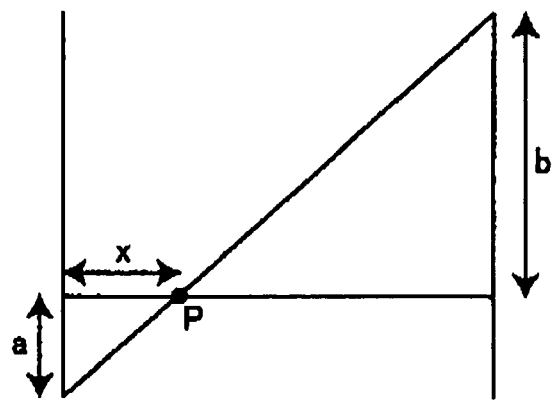
FIGS. 5A and 5B are schematic diagrams for describing an operation of detecting a zero crossing point with a zero crossing detection circuit according to an embodiment of the present invention.
Figure 5B:
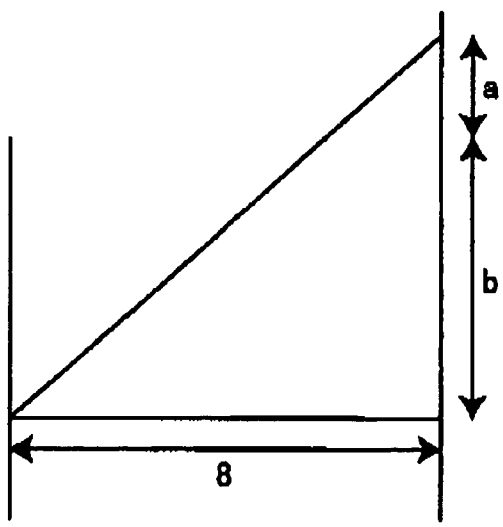

Next, an operation of detecting the zero-crossing point with the zero-crossing detecting circuit 5 is described. FIGS. 5A and 5B are schematic diagrams for describing a zero-crossing detection operation by the zero-crossing detecting circuit 5 according to an embodiment of the present invention. As shown in FIG. 5A, the zero-crossing point can be obtained by performing linear interpolation on the data signal Db output from the digital BPF 4. The zero-crossing detecting circuit 5 can detects the position of the zero-crossing point P for each period of the data signal Db by obtaining the time "x" starting from the beginning of period T to the point when zero-crossing point P is detected.

In this example, "x" satisfies a relationship of $a:x=(a+b):8$ as shown in FIGS. 5A and 5B. Accordingly, "x" can be expressed with a formula $x=8a/(a+b)$.

Figure 6:
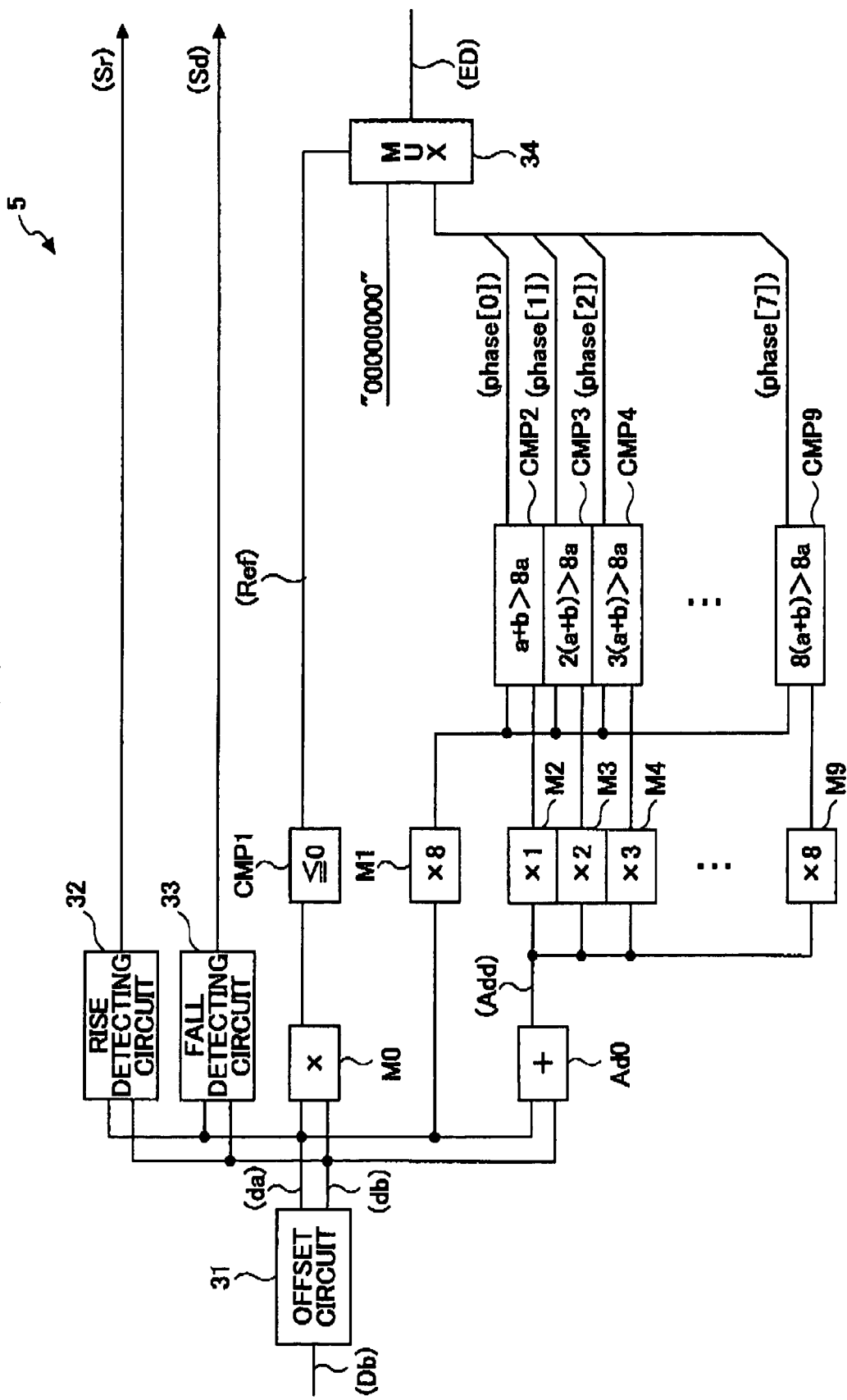
FIG. 6 is a block diagram showing an exemplary configuration of a zero crossing detection circuit according to an embodiment of the present invention.

FIG. 6 is a block diagram showing an exemplary configuration of the zero-crossing detecting circuit 5 that obtains the value of "x". As shown in FIG. 6, the zero-crossing detecting circuit 5 includes, for example, an offset circuit 31, a rise detecting circuit 32, a fall detecting circuit (drop detecting circuit) 33, multipliers M0 through M9, comparators CMP1 through CMP9, an adder Ad0, and a multiplexer 34. The offset circuit 31 subtracts 4 (center value of 0 through 8) from each of the two consecutive values of the data signal Db output from the digital BPF 4 and outputs the subtraction results as data da and db. For example, in a case where "2" and "6" are consecutively output from the digital BPF 4 as the values of the data signal Db, the resultant data da and db are "–2" and "2". The offset circuit 31 outputs the data da to the rise detecting circuit 32, the fall detecting circuit 33, each of the multipliers M0, M1, and the adder Ad0 and outputs data db to the rise detecting circuit 32, the fall detecting circuit 33, the multiplier M0, and the adder Ad0. The rise detecting circuit 32 and the fall detecting circuit 33 output signal Sr or Sd according to the sign bit of the input data da, db. For example, in a case where the sign bits for the data da, db are "1" and "0", respectively, the rise detecting circuit 32 outputs a two bit signal [1,0] as its rise detection signal Sr. In other cases, the rise detecting circuit 32 outputs a two bit signal [0,0]. Meanwhile, in a case where the sign bits for each the data da, db are "0" and "1", respectively, the fall detecting circuit 33 outputs a two bit signal [0,1] as its fall detection signal Sd. In other cases, the fall detecting circuit 33 outputs a two bit signal [0,0]. It is to be noted that, in a case where the sign bit of the data (da, db) is "0", the data indicate either zero or a positive value. In a case where the sign bit of the data (da, db) is "1", the data indicate a negative value. The rise detecting circuit 32 and the fall detecting circuit 33 serve as an edge determining circuit part.

The multiplier M0 multiplies the two data da, db and outputs the multiplication results. The CMP 1 compares the multiplication results and a value "0" and outputs a signal Ref to the MUX 34 in accordance with the comparison results. Furthermore, the absolute values "a" and "b" of the two data da and db are added by the adder Ad0. Then, the adder Ad0 outputs the addition results as Add signals to each multiplier M2 through M9. The multipliers M2 through M9 multiply the values of the input Add signals with one through eight (one through eight times), respectively, and output the multiplied values to corresponding comparators CMP2 through CMP9. Meanwhile, the multiplier M1 multiplies the absolute value "a" of the data da with eight (eight times) and outputs the multiplied value to each of the comparators CMP2 through CMP9. The comparators CMP2 through CMP9 compare the multiplied value output from the multiplier M1 (8×a) with corresponding multiplied values output from the multipliers M1 through M9 ((a+b) through 8×(a+b)) and output phase [0] signal through phase [7] signal indicative of the comparison results, respectively. For example, in a case of a given phase [k] signal (k=0 through 7), the phase [k] signal is "1" when satisfying a relationship of "(k+1)×(a+b)>8×a" and is "0" when not satisfying this relationship.

The output signal Ref of the comparator CMP1, the 8 bit signal [00000000], and the output phase signals phase [0] through phase [7] of respective comparators CMP2 through CMP9 are input to the MUX 34. In a case where the Ref signal indicates that the multiplication result (multiplication value) of the multiplier M0 is greater than 0, the MUX 34 outputs the 8 bit signal [00000000]. In a case where the Ref signal indicates that the multiplication result (multiplication value) of the multiplier M0 is no greater than 0 (i.e. 0 or a negative value), the MUX 34 generates an 8 bit signal EF from the eight one-bit phase signals phase [0] through phase [7] and outputs the generated 8 bit signals ED. For example, in case where the multiplication result is no greater than 0, the MUX 34 outputs [01000000] as the 8 bit signal ED when a relationship of "(a+b)<8a<2(a+b)" is satisfied. With the above-described configuration, the zero-crossing detecting circuit 5 can detect the zero-crossing point of the data signal Db for each time resolution unit T/8.

Figure 7:
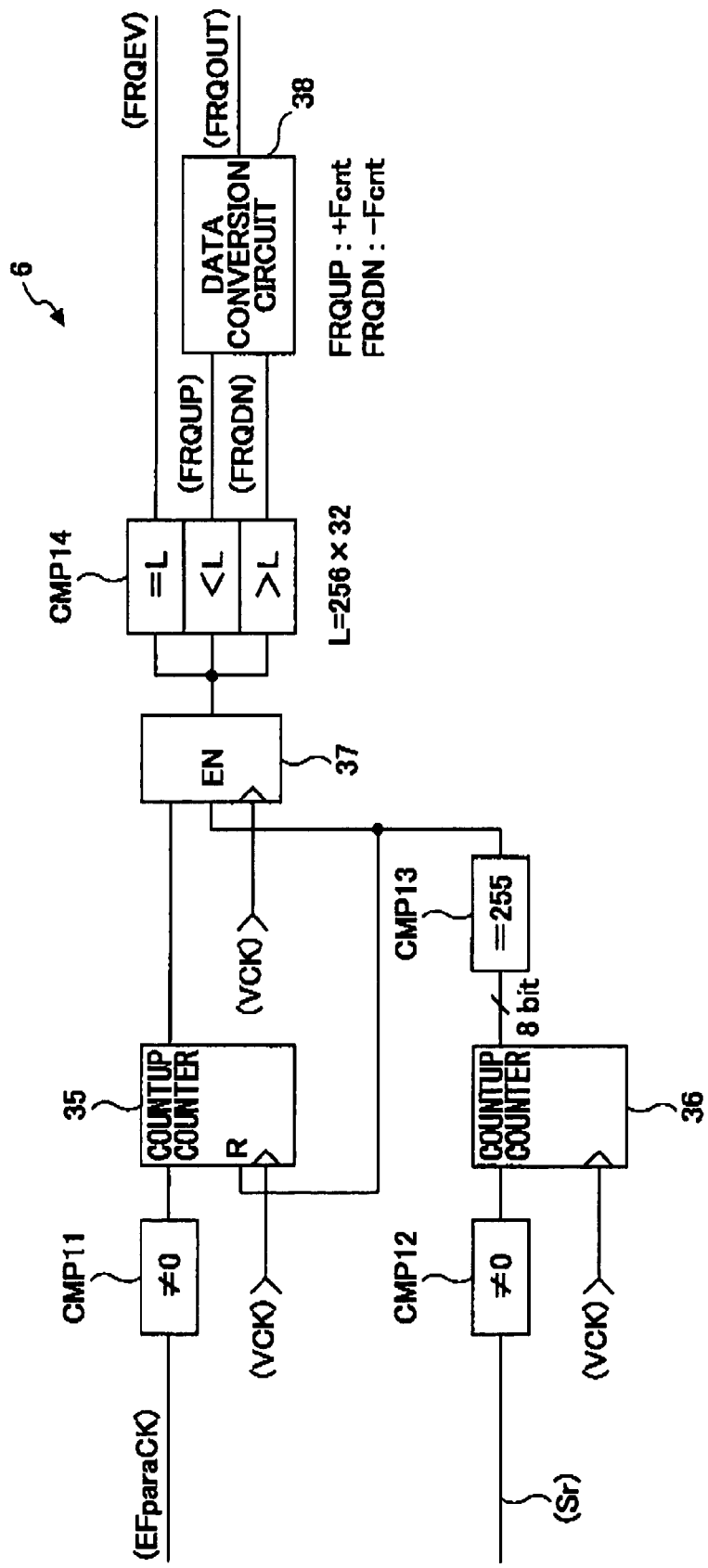
FIG. 7 is a circuit diagram showing an exemplary configuration of a FRQ control circuit according to an embodiment of the present invention.

Next, the FRQ control circuit 6 is described. FIG. 7 is a circuit diagram showing an exemplary configuration of the FRQ control circuit 6. As shown in FIG. 7, the FRQ control circuit 6 includes, for example, four comparators CMP11 through CMP14, two countup counters 35, 36, a D-flip-flop 37 with enable, and a data conversion circuit 38. It is to be noted that the countup counter 36 serves as a first counter and the countup counter 35 serves as a second counter. Furthermore, the comparator CMP14 serves as a first comparison circuit part and the data conversion circuit 38 serves as a frequency difference signal generating circuit part.

The comparator CMP11 compares the value of the edge position signal EFparaCK with "0 (00000000)" and outputs the comparison results to the countup counter 35. The countup counter 35 counts up the number of times in which the value of the edge position signal EFparaCK is not 0 (i.e. counts up when any one of the bit data items included in the edge position signal EFparaCK is "1"). Meanwhile, the comparator CMP12 compares the value of the rise signal Sr with "0 (0,0)" and outputs the comparison results to the countup counter 36. The countup counter 36 counts up the number of the times in which the value of the rise detection signal Sr output from the zero-crossing detecting circuit 5 is not 0 (counts up when the rise detection signal Sr becomes [1, 0]. It is to be noted that the time when the rise detection signal Sr becomes [1,0] is the time when the zero-crossing detecting circuit 5 detects the zero-crossing point of the rising edge (i.e. the time when the zero-crossing detecting circuit 5 detects the edge of the rise of the wobble signal Wb).

The comparator 13 compares the counted value of the countup counter 36 and a first predetermined value. In this example, the first predetermined value is 255. Since the counted value is expressed with 0 through 255, a case where the counted value becomes equal to 255 would be the same as a case where the zero-crossing detecting circuit 5 detects the zero-crossing point of the rise-edge for 256 times. When the counted value of the countup counter 36 reaches 255, the CMP 13 enables (validates) the D-flip-flop 37 and resets the countup counter 35. When the D-flip-flop 37 is enabled, the values counted up by the countup counter 35 are output until the countup counter 36 counts up from 0 to 255. The CMP 14 compares the counted values of the countup counter 35 with a second predetermined value L. For example, in a case of a DVD+R, K can be set as "K=256×32" since a writing reference clock signal is defined so that 32 clocks correspond to a single wobble. In this case, when K (K=256×32) rising edges of the writing reference clock signal are detected from the edge position signal EFparaCK during a period of detecting the zero-crossing point of the rising edge for 256 times, that is, a period of detecting 256 wobbles, it can be determined that the frequency of the writing reference clock signal matches a desired frequency. It is to be noted that the value of the second predetermined value L may be set as a predetermined range around the value of 256×32. In this case, it can be determined that the frequency of the writing reference clock signal matches a desired frequency when the counted value of the countup counter 35 is within the predetermined range.

In a case where the counted value output from the D-flip-flop 37 is less than the second predetermined value L, the CMP 14 generates a FRQUP signal and outputs the generated FRQUP signal to the data conversion circuit 38. Furthermore, in a case where the counted value output from the D-flip-flop 37 is greater than the second predetermined value L, the CMP 14 generates a FRQDN signal and outputs the generated FRQDN signal to the data conversion circuit 38. The data conversion circuit 38 outputs frequency difference signals FRQOUT of different values in accordance with the input signals (FRQUP signal, FRQDN signal). More specifically, the data conversion circuit 38 outputs a frequency difference signal FRQOUT indicative of a positive constant +Fcnt when a FRQUP signal is input from the CMP 14 and outputs a frequency difference signal FRQOUT indicative of a negative constant +Fcnt when a FRQDOWN signal is input from the CMP 14. Here, when the MUX 8 selects the input FRQOUT signal and outputs the selected signal to the VCO 14 in a case where the FRQOUT signal indicates a positive constant +Fcnt, the VCO 14 generates clock data DIVCNT0 through DIVCNT7 and an edge position signal EFparaCK so that the frequency of the writing reference clock signal becomes higher. In a case where the FRQOUT signal indicates a negative constant −Fcnt, the VCO 14 generates clock data DIVCNT0 through DIVCNT7 and an edge position signal EFparaCK so that the frequency of the writing reference clock signal becomes lower. More specifically, in a case where the frequency signal FRQOUT indicates a positive constant +Fcnt, the VCO 14 generates an edge position signal EFparaCK indicating an edge position of a writing reference clock signal having a higher frequency. In a case where the frequency signal FRQOUT indicates a negative constant −Fcnt, the VCO 14 generates an edge position signal EFparaCK indicating an edge position of a writing reference clock signal having a lower frequency.

Meanwhile, in a case where the counted value output from the D-flip-flop 37 is equal to the second predetermined value L, the comparator 14 outputs a predetermined FRQEV signal. With reference to FIG. 1, the control circuit 17 outputs a FRQMODE control signal to the MUX 8. The control circuit 17 changes the FRQMODE control signal depending on whether the FRQEV signal is output from the FRQ control circuit 6. For example, the control circuit 17 changes the FRQMODE signal from L (Low) to H (High) when the FRQQEV signal is output from the FRQ control circuit 6. In a case where the FRQMODE control signal of L (Low) level is input to the MUX 8, the MUX 8 selects the frequency difference signal FRQOUT output from the FRQ control circuit 6 and outputs the selected FRQOUT signal. In a case where the FRQMODE control signal of H (High) level is input to the MUX 8, the MUX 8 selects the phase difference signal PDOUT output from the PD circuit 7. That is, the MUX 8 selects and outputs the frequency difference signal FRQOUT from the activation of the optical disk apparatus 1 until the input of the H level FRQMODE control signal to the MUX 8. After the H level FRQMODE control signal is input to the MUX 8, the MUX 8 selects and outputs the phase difference signal PDOUT.

Accordingly, with the optical disk apparatus 1 according to an embodiment of the present invention, a frequency difference signal FRQOUT is initially input to the VCO 14 and a phase difference signal PDOUT is input to the VCO 14 after the input of the frequency difference signal FRQOUT. That is, the optical disk apparatus 1 performs frequency acquisition with the FRQ control circuit 6 and then performs phase acquisition with the PD circuit 7. This prevents erroneous operation in which the VCO 14 becomes locked in a frequency of an integral multiple with respect to a desired frequency.

When a frequency difference signal FRQOUT or a phase difference signal PDOUT is output from the MUX 8, the gain adjusting circuit 9 multiplies the output signal with a value (Ksys value) indicated by a SKsys signal output from the control circuit 17 and outputs the multiplication results as a ga signal to the gate circuit 10. The gate circuit 10 either proceeds with outputting the ga signal or cancels output of the ga signal depending on a HLDMODE control signal output from the control circuit 17. For example, the gate circuit cancels output of the ga signal when the HLDMODE signal is a H (High) level and proceeds with the output of the ga signal when the HLDMODE signal is a L (low) level. In a case of proceeding with the output of the ga signal, the gate circuit 10 outputs a Sg signal. The Sg signal is input to the adder 12 and the loop bandwidth setting circuit 11. It is to be noted that the Ksys value which is multiplied by the gain adjusting circuit 9 is stored beforehand in the register 21 of the control circuit 17. Furthermore, the control circuit 17 may output SKsys signals of different Keys values depending on whether a predetermined FRQEV signal is output from the FRQ control circuit 6, that is, depending on whether the MUX 8 is outputting a frequency difference signal FRQOUT or a phase difference signal PDOUT to the gain adjusting circuit 9.

The gate circuit 10 is effective in a case where the optical disk apparatus 1 is used in an optical disk drive apparatus. For example, in a case where a scratch or a defect is detected on a disk, a phase comparing operation can be cancelled by setting the HLDMODE control signal to a H (High) level, to thereby, prevent irregularity of the writing reference clock signal. This enables the optical disk apparatus 1 to generate writing reference clock signals more stably, The loop bandwidth setting circuit 11, in accordance with the edge position signal EFparaCK output from the VCO 14, integrates the Sg signal output from the gate circuit 10 in periods corresponding to the periods of writing reference clock signals and outputs an Sint signal as a result of the integration. The adder 12 adds the Sg signal output from the gate circuit 10 and the Sint output from the loop bandwidth setting circuit 11. The adder 12 outputs the addition results to the offset canceling circuit 13. The offset canceling circuit 13 is for canceling the offset of the offset circuit 31 in the zero-crossing detecting circuit 5. More specifically, the offset circuit 13 addes $2^{(8-1)}$ to the signal (results) output from the adder 12 and outputs the addition results to the VCO 14 as a VCOIN signal. It is to be noted that the configuration and operation of the loop bandwidth setting circuit 11 is described in further detail below.

Figure 8:
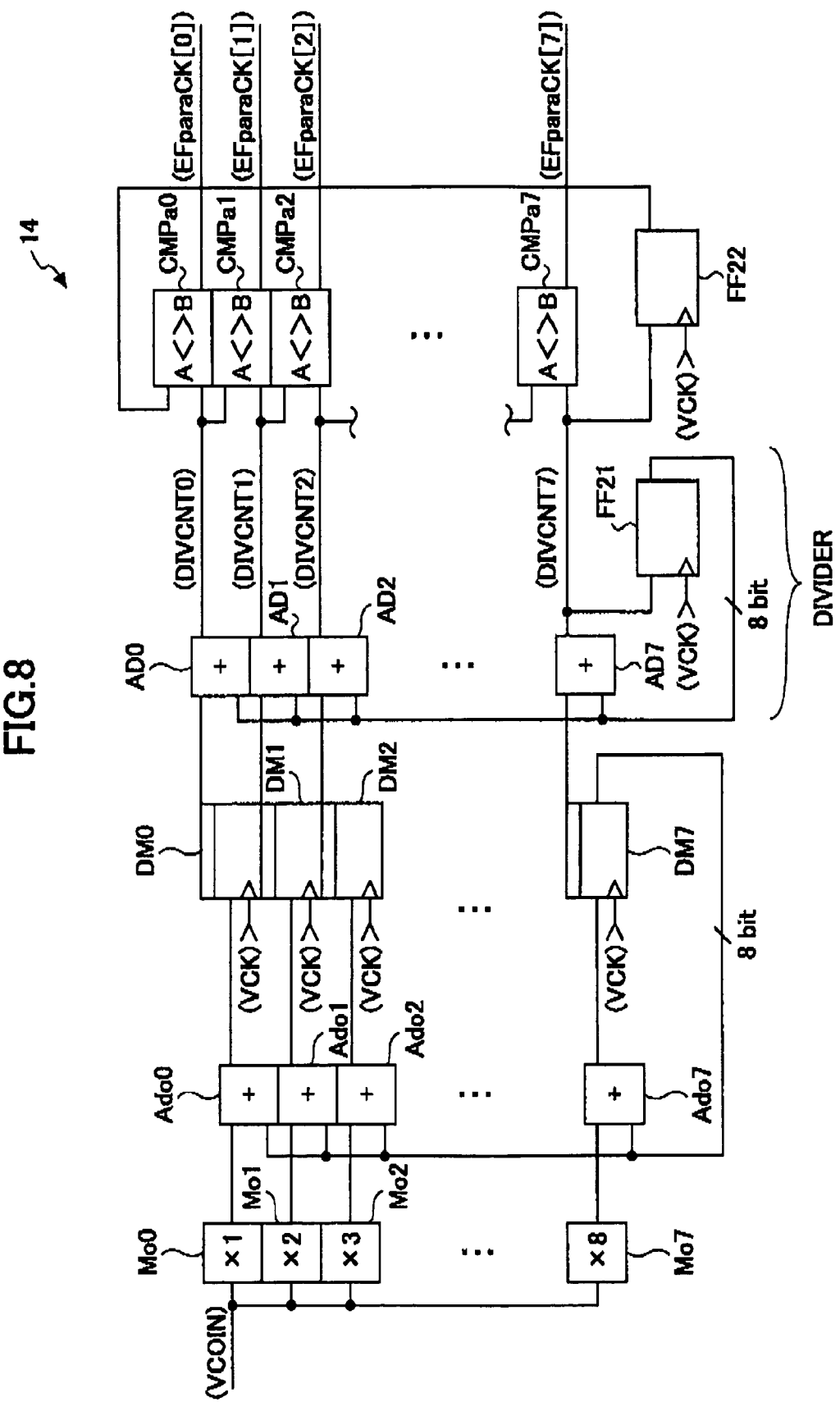
FIG. 8 is a circuit diagram showing an exemplary configuration of a VCO according to an embodiment of the present invention.

Next, a configuration and operation of the VCO 14 according to an embodiment of the present invention is described with reference to FIG. 8. FIG. 8 is a circuit diagram showing an exemplary configuration of the VCO 14. As shown in FIG. 8, the VCO 14 includes eight multipliers Mo0 through Mo7, sixteen adders Ado0 through Ado7, Ad0 through Ad1, eight data storing circuits DM0 through DM7, two D-flip-flops FF21, FF22, and eight comparators CMPa0 through CMPa7. In accordance with the fixed clock signal VCK, each of data storing circuits DMO through DM7 stores input data. In addition, each of the data storing circuits DMO through DM7 detect the number of times of overflow of the input data and outputs overflow signals indicative of the detection results. Multipliers Mo1 through Mo7 serves as a multiplying circuit. Data storing circuits DM0 through DM7 serve as a first data storing circuit, Adders Ado through Ado7 serve as a first adding circuit. The D-flip-flop FF21 serves as a second data storing circuit. Each adder ADO through AD7 serves as a second adding circuit.

As shown in FIG. 8, the VCOIN signal output from the offset canceling circuit 13 is input to each multiplier Mo0 through Mo7. In a case of a given multiplier Mok, a given adder Adok, a given data storing circuit DMk, and a given adder ADk, the multiplier Mok multiplies the data of an input VCOIN signal with (k+1) and outputs data indicative of the multiplication results to the adder Adok. The adder Adok adds the data output from the multiplier Mok and the data stored in the data storing circuit DM8 and outputs data indicative of the addition results to the data storing circuit DMk. Furthermore, the data storing circuit DMk detects the number of times of overflow of input data and outputs overflow signals indicative of the detection results to the adder ADk. The adder ADk adds the data of the overflow signals output from the data storing circuit DMk and the data stored in the D-flip-flop FF21 and outputs clock data DIVCNTk indicative of the addition results. The clock data DIVCNT 7 output from the adder AD7 is input to the D-flip-flop FF21 in accordance with the fixed clock signal VCK. It is to be noted that each of the adders AD0 through AD7 and the D-flip-flop FF21 serves as a divider. The divider is for converting the frequency of the signal of the data output from each data storing circuit DM0 through DM7 to a frequency suitable for a writing reference clock signal. In addition, the divider is also for generating clock data DIVCNT0 through DIVCNT 7 input to the PD circuit 7.

Furthermore, in a case of a given comparator CMPak, two clock data items DIVCNT (k−1) and DIVCNTk are input to the comparator CMPak. The comparator CMPak compares the values (div(k−1)) of five high order bits of the clock data item DIVCNT (k−1) with the values (divk) of five high order bits of the clock data item DIVCNTk. In a case where a relationship of "divk>div(−1)" is satisfied, the comparator CMPak outputs data "1crossing " as the EFparaCK [k] data. In a case where a relationship of "divk≦div(k−1)" is satisfied, the comparator CMPak outputs data "0" as the EFparaCK [k] data. However, with respect to comparator CMPa0, it is to be noted that a clock data item DIVCNT 0 and an output data item of the D-flip-flop 22 are input to the comparator CMPa0. The comparator CMPa0 compares the values of five high order bits of the clock data item DIVCNT0 with the values of five high order bits of the data output from the D-flip-flop 22. In a case where the value of the five high order bits of the clock data item DIVCNT0 is greater than the value of the five high order bits of the output data of the D-flip-flop 22, the comparator CMPa0 outputs data "1" as the EFparaCK [0] data, In a case where the value of the five high order bits of the clock data item DIVCNT0 is no greater than the value of the five high order bits of the output data of the D-flip-flop 22, the comparator CMPa0 outputs data "0" as the EFparaCK [0] data.

It is to be noted that clock data DIVCNT7 output from the adder AD7 is input to the D-flip-flop 22 in accordance with the fixed clock signal VCK.

The EFparaCK [7:0] signal including EF paraCK [0] data through EFparaCK [7], that is, the frequency fvcock of the edge position signal EFparaCK can be expressed as "fvcock= (8× fvck/$2^8$)×vcoin", wherein "vcoin" is the value of the data of the input signal VCOIN and "fvck" is the frequency of the fixed clock signal VCK. That is, by increasing the bit width of the EFparaCK signal output from the VCO 14 (i.e. bit width indicating the edge position of the writing reference clock signal) while having the frequency of the operating clock of the VCO 14 maintained to fvck (frequency of the fixed clock signal VCK), the time resolution of the writing reference clock signals can be expanded.

Figure 9:
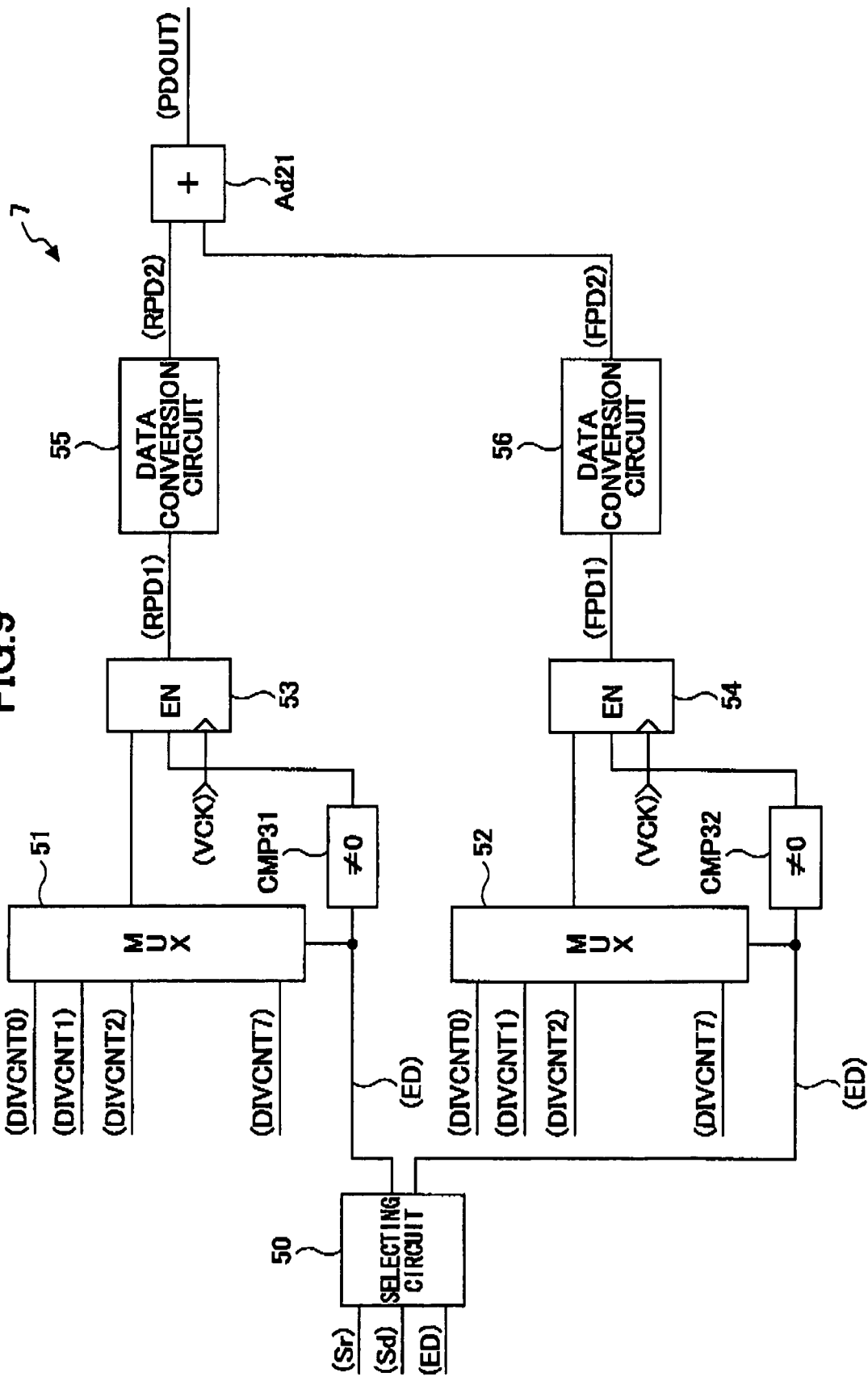
FIG. 9 is a circuit diagram showing an exemplary configuration of a PD circuit according to an embodiment of the present invention.

Next, the PD circuit 7 is described with reference to FIG. 9. FIG. 9 is a circuit diagram showing an exemplary configuration of the PD circuit 7. As shown in FIG. 9, the PD circuit 7 includes a selecting circuit 50, two multiplexers MUX 51, MUX 52, two comparators CMP 31, CMP 32, two D-flip-flops with enable 53, 54, two data conversion circuits 55, 56, and an adder Ad21. It is to be noted that the selecting circuit 50, MUX 51, MUX 52, comparators CMP 31, CMP 32, and D-flip-flops 53, 54 serve as a (first) selecting circuit part, Furthermore, data conversion circuits 55, 56 and the adder Ad21 serve as a phase difference signal generating circuit part.

A rise detection signal Sr, a fall detection signal (drop detection signal) Sd, and a position detection signal ED, which are output from the zero-crossing-detecting circuit 5, are input to the selecting circuit 50. When the input rise detection signal Sr becomes [1,0], the selecting circuit 50 outputs a position detection signal ED to the MUX 51 and the comparator CMP31. When the input fall detection signal Sd becomes [0,1], the selecting circuit 50 outputs a position detection signal ED to the MUX 52 and the comparator CMP32, First, a case where the rise detection signal Sr is [1,0] is described, Clock data DIVCNT0 through DIVCNT7 output from corresponding adders AD0 through AD7 in the VCO 14 are input to the MUX 51. The MUX 51 selects one of the clock data (clock data item) from the clock data DIVCNT0 through DIVCNT7 and outputs the selected clock data to the D-flip-flop 53. Meanwhile, the comparator CMP31 enables the D-flip-flop 53 in a case where the input position detection signal ED is not [00000000]. When the D-flip-flop 53 is enabled, the clock data output from the MUX 51 at that time is output from the D-flip-flop 53 as RPD1 data.

Figure 10:
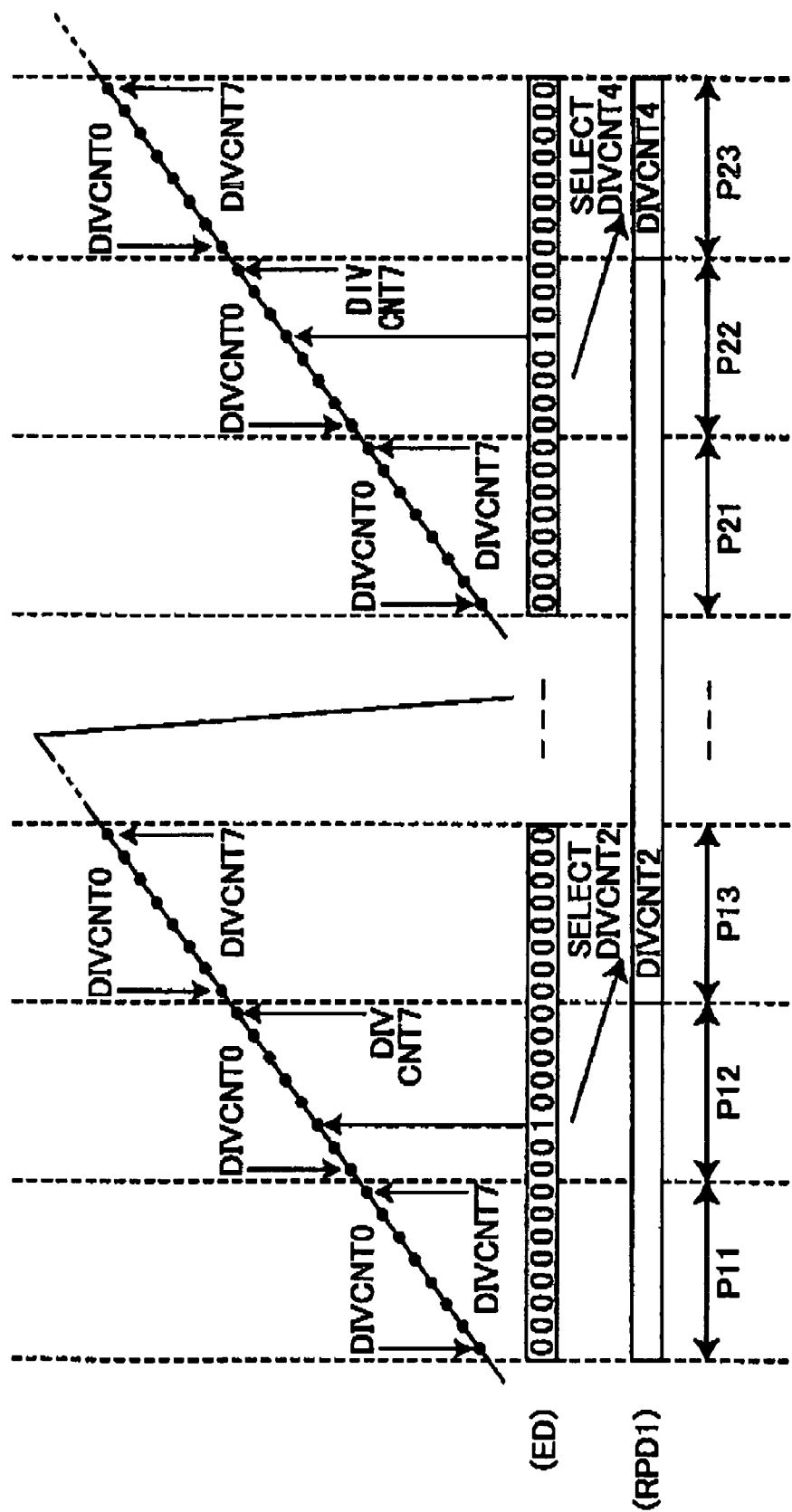
FIG. 10 is a schematic diagram for describing an operation of a PD circuit according to an embodiment of the present invention.

FIG. 10 shows a relationship of the clock data DIVCNT0 through DIVCNT7 input from the MUX 51 and the RPD1 data output from the D-flip-flop 53 in the PD circuit 7 shown in FIG. 9. Clock data DIVCNT0 through DIVCNT7 from the VCO 14 are input to the MUX 51 each single period 7. The periods P11, P12, P13, P21, P22, P23 shown in FIG. 10 each represent period T. As shown in FIG. 10, the value of the clock data DIVCNT0 through DIVCNT7, which is input in each of the periods P11-P13 and P21-P23, is incremented with a value of 1. Furthermore, the value of the clock data DIVCNT0, which is input in a given period, is one value greater than the value of the clock data DIVCNT7 which is one period earlier than the given period. For example, the value of the clock data DIVCNT0 input in period P12 is one value greater than the value of the clock data DIVCNT7 input in period P11. Accordingly, the value of the clock data DIVCNT0 through DIVCNT7 for each of the periods is incremented 1 value from 0 to 255. When the value of the clock data DIVCNT1 through DIVCNT7 reaches 255, the incrementing is started again from 0. Although this example describes a case where the value of the clock data DIVCNT0 through DIVCNT7 is incremented with a value of 1, the value of the clock data DIVCNT0 through DIVCNT7 may change in a different manner. In a case of a given clock data DIVCNTk for each period (k=0 to 7), the value of the clock data DIVCNTk is either equal to the value of the clock data DIVCNT (k−1) or one value greater than the value of the clock data DIVCNT (k−1). It is to be noted that the value of the clock data DIVCNT0 of a given period is equal to the value of the clock data DIVCNT7 input one period before the given period or one value greater than the value of the clock data DIVCNT 7.

In this example, each of the clock data DIVCNT0 through DIVCNT7 corresponds to the time T/8 obtained by dividing the period T of the fixed clock signal VCK into eight parts. When the rise edge of the wobble signal is detected in a case where a position detection signal ED other than 0 is input to the MUX 51, the MUX 51 selects and outputs single digital clock data in correspondence with the timing of the detection. For example, as shown in FIG. 10, the MUX 51 selects and outputs the clock data DIVCNT2 when a position detection signal ED of [00100000] is input. The D-flip-flop 53 outputs the input clock data DIVCNT2 as the RPD1 data. In a case where a position detection signal ED of [00001000] is input, the MUX 51 selects clock data DIVCNT4 and outputs the clock data DIVCNT4 to the D-flip-flop 53. The D-flip-flop 53 outputs the input clock data DIVCNT4 as the RPD1 data.

Returning to FIG. 9, the RPD data output from the D-flip-flop 53 is input to the data conversion circuit 55. The data conversion circuit 55 uses a first predetermined table for converting the input RPD1 data to RPD2 data and outputs the converted data. In this example, the following Table 1 corresponds to the first predetermined table. The Table 1 is for showing the relationship between the RPD1 before the conversion of the data and the RPD2 after the conversion.

TABLE 1

| RPD1 | RPD2 |
|---|---|
| 128~191 | 0 |
| 192 | −64 |
| 193 | −63 |
| . | . |
| . | . |
| . | . |
| 244 | −2 |
| 255 | −1 |
| 0 | 0 |
| 1 | 1 |
| 2 | 2 |
| . | . |
| . | . |
| 62 | 62 |
| 63 | 63 |
| 64~127 | 0 |

As shown in Table 1, the data conversion circuit 55 converts the input RPD1 data having values 0 through 63 to corresponding RPD2 data having values 0 through 63 and outputs the converted data. Furthermore, the data conversion circuit 55 converts the RPD1 data having values of 192 through 255 to corresponding RPD2 data having values of −64 through −1 and outputs the converted data. Furthermore, the data conversion circuit 55 converts the input RPD1 data having values of 64 through 191 to the RPD2 data having a value of 0 and output the converted data.

The same can be said in a case where the fall detection signal Sd is [0,1]. In this case, position detection signal ED is input to the MUX 52 and the comparator CMP32. When the fall edge of the wobble signal is detected from the position detection signal ED, the MUX 52 selects one of the clock data (clock data item) corresponding to the detected timing from the input clock data DIVCNT0 through DIVCNT7 and outputs the selected clock data to the D-flip-flop 54. Furthermore, the comparator CMP32 enables the D-flip-flop 54 in a case where the input position detection signal ED is not [00000000]. When the D-flip-flop 54 is enabled, the clock data output from the MUX 52 at the time when the D-flip-flop 54 is enabled is output from the D-flip-flop 54 as FPD1 data.

The data conversion circuit 56 uses a second predetermined table for converting the input FPD1 data to FPD2 data and outputs the converted data. In this example, the following Table 2 corresponds to the second predetermined table. The Table 2 is for showing the relationship between the FD1 before the conversion of the data and the FPD2 after the conversion.

TABLE 2

| FPD1 | FPD2 |
|---|---|
| 0~63 | 0 |
| 64 | −64 |
| 65 | −63 |
| . | . |
| . | . |
| 126 | −2 |
| 127 | −1 |
| 128 | 0 |
| 129 | 1 |
| 130 | 2 |
| . | . |
| . | . |
| 190 | 62 |
| 191 | 63 |
| 192~255 | 0 |

As shown in Table 2, the data conversion circuit 56 converts the input FPD1 data having values 64 through 191 to corresponding FPD2 data having values −64 through 63 and outputs the converted data. Furthermore, the data conversion circuit 56 converts the FPD1 data having values of 0 through 63, 192 through 255 to corresponding FPD2 data having a value of 0 and outputs the converted data.

The adder Ad21 adds the RPD2 data output from the data conversion circuit 55 and the FPD2 data output from the data conversion circuit 56 and outputs the addition results as a phase difference signal PDOUT. For example, in a case where the value of the phase difference signal PDOUT is expressed as "q" ("q" being a positive integer), the writing reference clock signal is q phases early with respect to the wobble signal wb. In a case where the value of the phase difference signal PDOUT is expressed as "−q", the writing reference clock signal is q phases delayed with respect to the wobble signal Wb. That is, whether the writing reference clock signal is early or delayed with respect to the wobble signal Wb can be clearly distinguished by converting the data with the data conversion circuits 55, 56.

Figure 11:
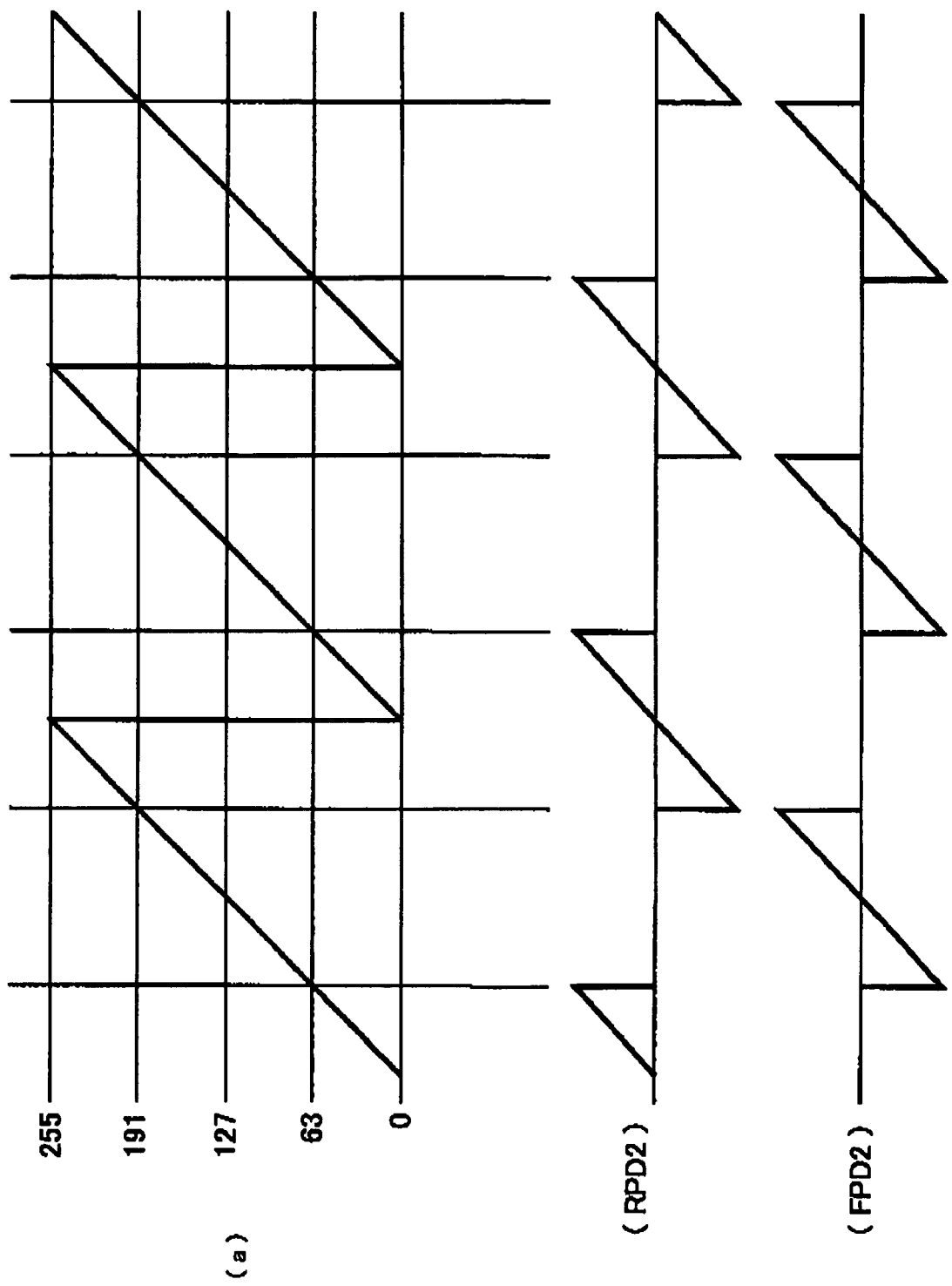
FIG. 11 are graphs showing the value of data RPD 2 output from a data conversion circuit 55 in a case where data RPD 1 having value "a" are input to the data conversion circuit 55 and the value of data FPD 2 output from a data conversion circuit 56 in case where data FPD 1 having value "a" are input to the data conversion circuit 56 according to an embodiment of the present invention.

FIG. 11 is a graph for making it easier to understand the relationship between Table 1 and Table 2. More specifically, the graph shown in FIG. 11 indicates the values of the RPD2 data output from the data conversion circuit 55 in a case where RPD1 data having value "a" are input and the values of the FPD2 data output from the data conversion circuit 56 in a case where the FPD1 data having value "a" are input.

Figure 12:
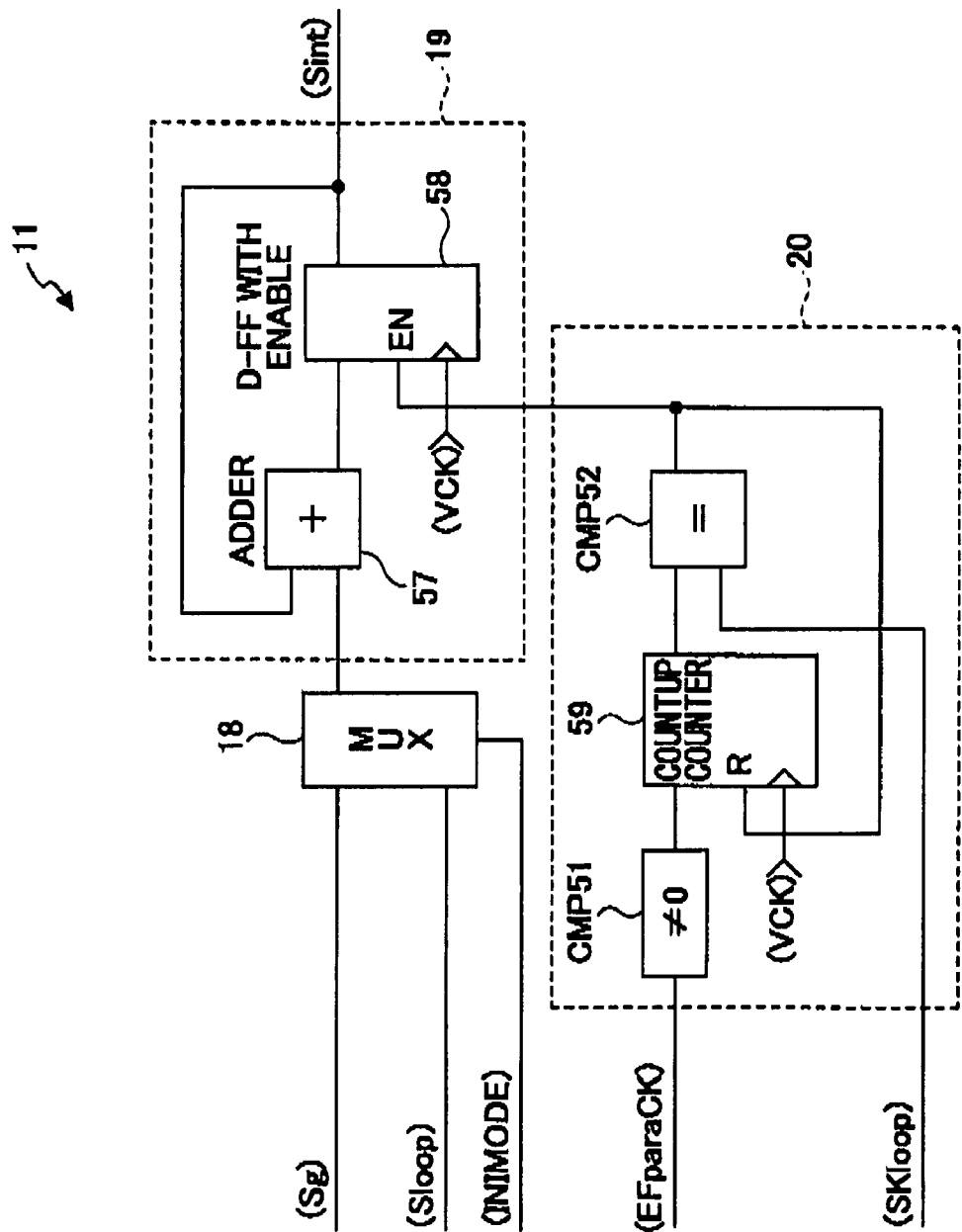
FIG. 12 is a circuit diagram showing an exemplary configuration of a loop bandwidth setting circuit according to an embodiment of the present invention.

FIG. 12 is a circuit diagram showing an exemplary configuration of the loop bandwidth setting circuit 11. As shown in FIG. 12, the loop bandwidth setting circuit 11 includes a MUX 18, an integrating circuit 19, and an integration period setting circuit 20. The integrating circuit 19 includes an adder 57 and a D-flip-flop 58 with enable serving to latch a signal output from the adder 57. Furthermore, the integration period setting circuit 20 includes two comparators CMP51, CMP52 and a countup counter 59 It is to be noted that the MUX 18 serves as a second (third) selection circuit part, the countup counter 59 serves as a (third) counter, and the comparator CMP52 serves as a second comparison circuit part. Furthermore, the adder 57 and the D-flip-flop 58 serve as a second addition circuit part.

The comparator CMP51 compares the edge position signal EFparaCK with value "0" and outputs the comparison results to the countup counter 59. The comparator CMP51 detects the rise edge or the fall edge of the writing reference clock signal from the edge position signal EFparaCK output from the VCO 14. The countup counter 59, based on the fixed clock signal VCK, counts the number of rise edges or the fall edges of the writing reference clock signal (i.e. number of times when the edge position signal is not "0") from the comparison results output from the comparator CMP51 and outputs the counted value to the comparator CMP52. The comparator CMP52 compares the counted value of the countup counter 59 with the value of a predetermined dividing coefficient Kloop indicated by a control signal Skloop input from the control circuit 17. When the compared values are equal, the comparator CMP52 resets the countup counter 59 and enables the D-flip-flop 58 of the integration circuit 19. For example, in a case where the division coefficient Kloop is 2 (Kloop=2), the integration circuit 19 integrates the output signal of the MUX 28 each time the value of the countup counter 59 becomes 2. More specifically, each time the value of the countup counter 59 becomes 2, the adder 57 adds the output signal of the D-flip-flop 58 and the output signal of the MUX 18. The D-flip-flop 58 outputs a Sint signal indicative of the addition results.

In this example, the SKloop signal input from the control circuit 17 may indicate a division coefficient Kloop of different values depending on whether the signal Sg input from the MUX 18 is a FRQOUT signal or a PDOUT signal. The values of the division coefficient Kloop is stored beforehand in the register 21 of the control circuit 17. It is to be noted that the control circuit 17 can determine the type of the signal input to the MUX 18 depending on whether a FRQEV control signal is input, and output a SKloop having division coefficient Kloop in accordance with the determination results.

Furthermore, the MUX 18 selects either the Sg signal input from the gate circuit 10 or the Sloop signal input from the control circuit 17 in accordance with an INIMODE control signal input from the control circuit 17 and outputs the selected signal. For example, the MUX 18 selects and outputs the Sg signal input from the gate circuit 10 when the INIMODE control signal is a H (High) level. The MUX 18 selects and outputs the Sloop signal input from the control circuit 17 when the INIMODE control signal is a L (Low) level. In this example, the value loopinidat of the Sloop signal is set as the initial value of integration (initial integration value) so that the Sloop signal can be selected before the Sg signal is selected by the MUX 18 by using the INIMODE control signal. Thereby, in a case where the frequency of the writing reference clock signal to be generated is known beforehand (i.e. in a case where the frequency of the wobble reproduced by a disk is known beforehand), a value suitable for the frequency of the writing reference clock signal can be set as the initial integration value. Therefore, with the optical disk apparatus 1 according to an embodiment of the present invention, the transition to a phase acquisition operation can be performed quickly without having to spend time on frequency acquisition. Thereby, lock time can be shortened.

Figure 13:
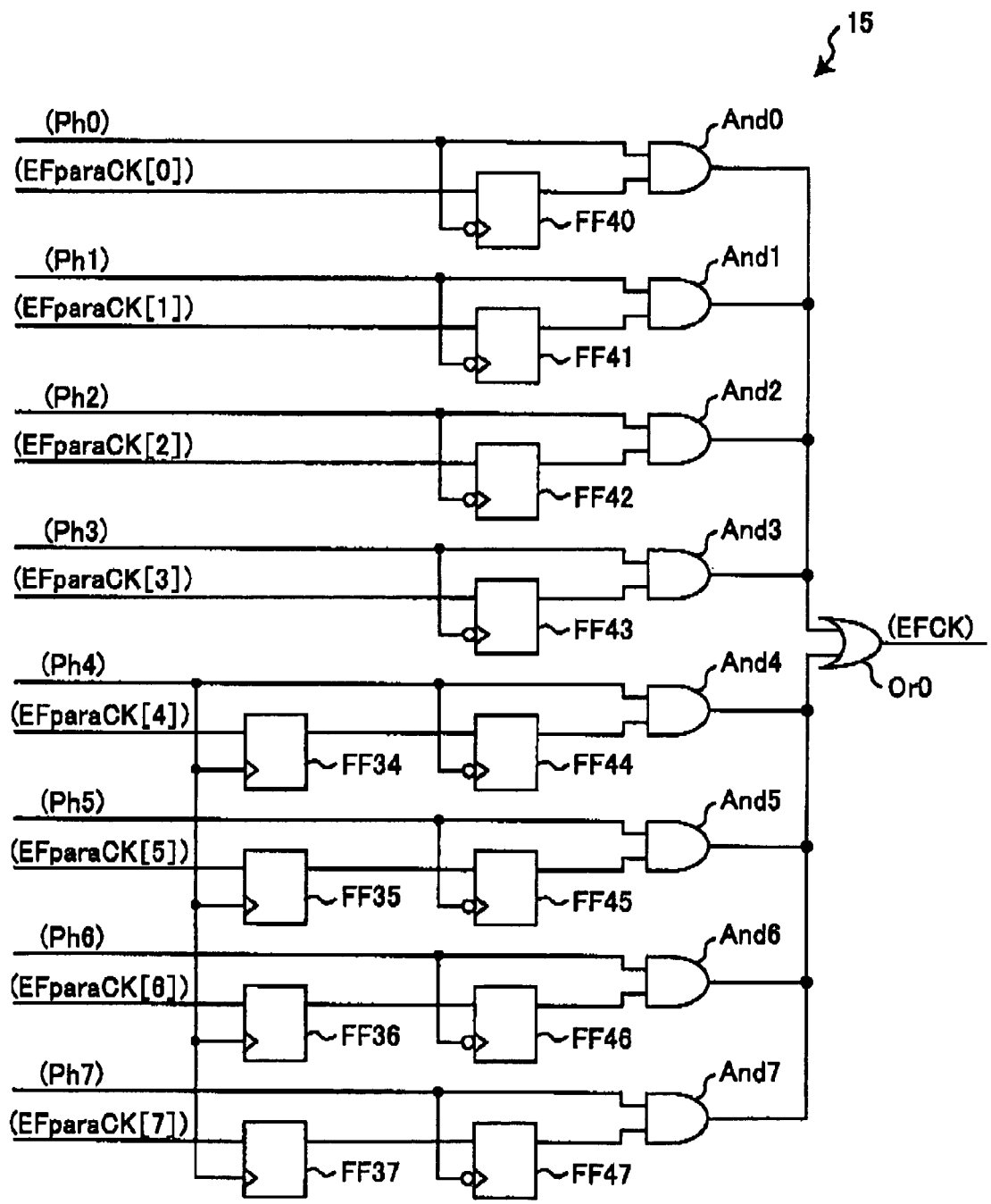
FIG. 13 is a circuit diagram showing an exemplary configuration of a parallel-to-serial conversion circuit according to an embodiment of the present invention.

FIG. 13 is a circuit diagram showing an exemplary configuration of a parallel-to-serial conversion circuit 15. As shown in FIG. 13, the parallel-to-serial conversion circuit 15 includes plural D-flip-flops FF34 through FF37, FF40 through FF47, plural AND circuits And0 through And7, and an OR circuit Or0. Data EFparaCK [4] through EFparaCK [7] and clock signal Ph4 are input to corresponding D-flip-flops FF34 through FF37. Furthermore, output data from the D-flip-flops FF34 through FF37 are input to corresponding D-flip-flops FF44 through FF47. In addition, clock signals Ph4 through Ph7 are inversely input to corresponding D-flip-flops FF44 through FF47. Furthermore, data EFparaCK [0] through EFparaCK [3] output from the VCO 14 are input to each corresponding D-flip-flop FF40 through FF43. In addition, clock signals Ph0 through Ph3 are inversely input to corresponding D-flip-flop FF40 through FF43.

Clock signals Ph0 through Ph7 are input to one of the input ends of the corresponding AND circuits And0 through And7 and each data item output from D-flip-flops FF40 through FF47 is input to the other input end of the corresponding AND circuit And0 through And7. The output signal of each AND circuit And0 through And7 is input to the OR circuit Or1.

Figure 14:
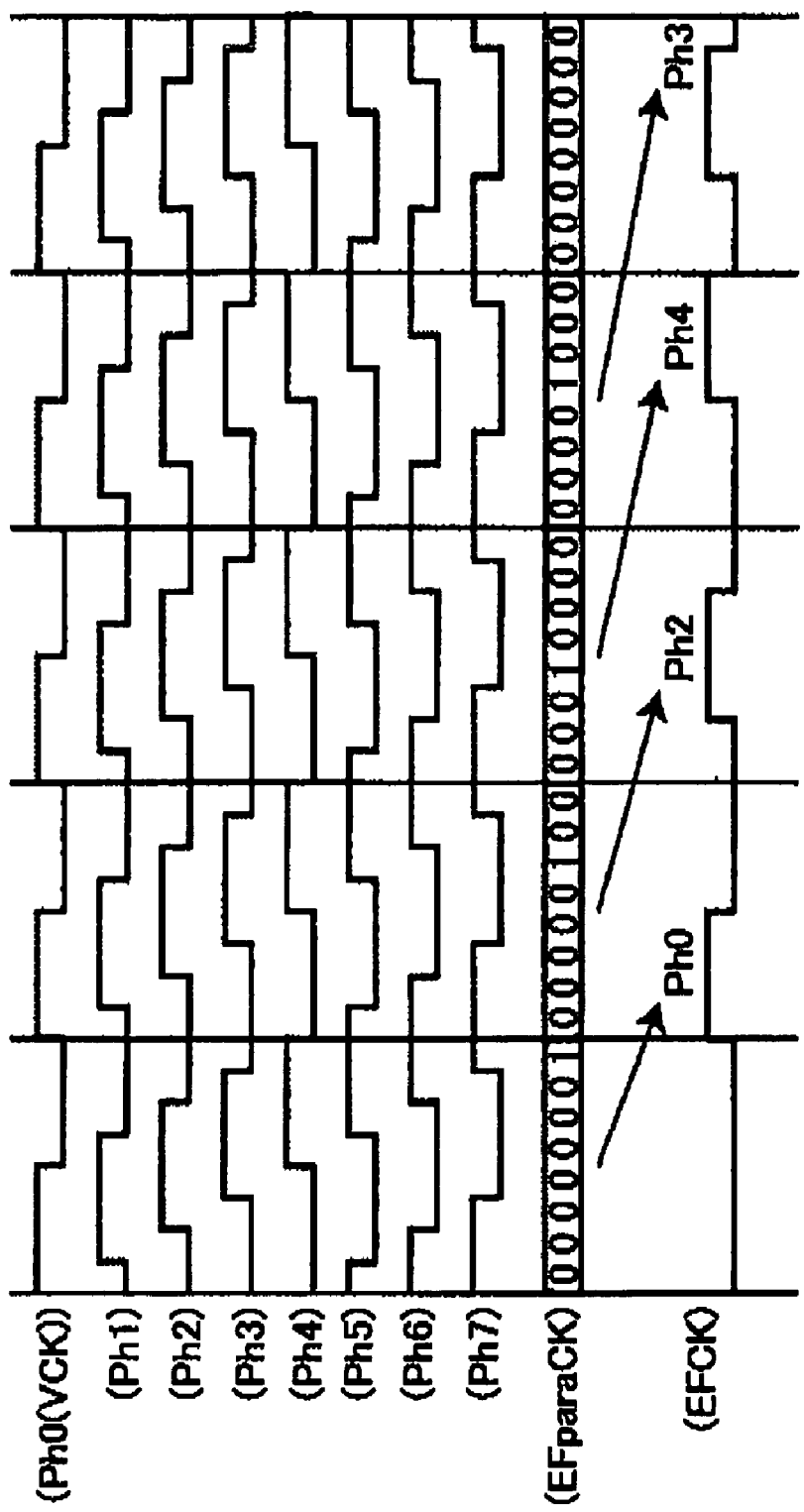
FIG. 14 is a waveform chart for describing an operation of a parallel-to-serial conversion circuit according to an embodiment of the present invention.

FIG. 14 is a waveform diagram for describing an operation of the parallel-to-serial conversion circuit 15 according to an embodiment of the present invention. As shown in FIG. 14, the parallel-to-serial conversion circuit 15 outputs signals having the same waveforms as corresponding clock signals Ph0 through Ph7 in accordance with the position of the edges indicated by the edge position signals EFparaCK input each single period T.

The optical disk apparatus 1 according to the above-described embodiment of the present invention is configured having a digital circuit that processes data in each period T of a single fixed clock signal after sampling each binary wobble signal Wb with N phase clock signals having different phases for each time resolution unit of T/N. Therefore, a DPLL circuit having a time resolution equal to a circuit operating in a frequency of N/T can be obtained by using the digital circuit operating in a frequency of 1/T. Furthermore, among the digital circuits which compose the entire optical disk apparatus 1, the digital circuit operating with N phase clock signals of different phases includes only a high speed sampling circuit 3 and a parallel-to-serial conversion circuit 15 that have a simple circuit configuration. Therefore, the synchronous design method used for digital circuits can be used in designing the optical disk apparatus 1. Therefore, the optical disk apparatus 1 can be easily designed. Thus, a DPLL circuit suitable for LSI can be realized. Although the it is describe above that "N=8", N may be set as "N=16" or "N=3" for further improving time resolution.

Figure 15:
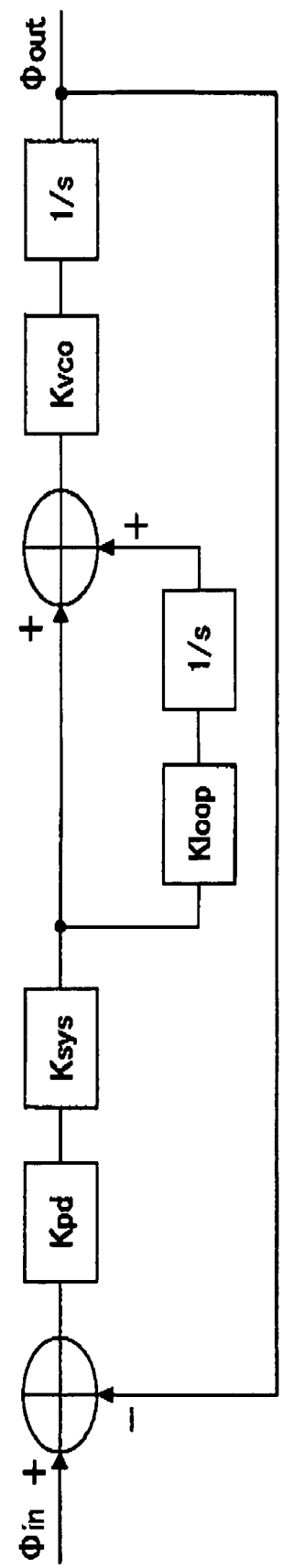
FIG. 15 is a block diagram for representing an optical disk apparatus by using a transfer function according to an embodiment of the present invention.

FIG. 15 is a block diagram showing a case where the optical disk apparatus 1 is expressed by using transfer functions. As shown in FIG. 15, the optical disk apparatus 1 can be expressed by using transfer functions in the same manner as a conventional DPLL circuit. An open-loop transfer function G (s) is expressed with the following Formula 1. In this example, constant "Kpd" indicates the gain of the PD circuit 7 and constant "Kvco" indicates the gain of the VCO 14.

$$G(s) = Kpd \times Ksys \times \left(1 + \frac{Kloop}{s}\right) \times Kvco \times \frac{1}{s} \quad \text{[Formula 1]}$$

The [Formula 1] can be expressed with the following simplified Formula 2 in which "K=Kpd×Ksys×Kvco" and "a=Kloop".

$$G(s) = \frac{K}{s} \times \left(1 + \frac{a}{s}\right) \quad \text{[Formula 2]}$$

Furthermore, a closed-loop transfer function H (s) is expressed with the following Formula 3.

$$H(s) = \frac{\Phi out}{\Phi in} = \frac{G(s)}{1 + G(s)} = \frac{K(s+a)}{s^2 + K \times s + K \times a} \quad \text{[Formula 3]}$$

The [Formula 3] can be expressed with the following simplified Formula 4 in which "K=2×ξ×$\omega_n$" and "K×a=$\omega_n^2$".

$$H(s) = \frac{2 \times \xi \times \varpi_n^2}{\xi^2 + 2 \times \xi \times \varpi_n \times s + \varpi_n^2} \quad \text{[Formula 4]}$$

Thus, the Formula 4 is a general formula of a complete integral second-order control system. In this example, "ξ" refers to a damping factor of the response (damping constant) and "$\omega_n$" refers to a fixed frequency. Furthermore, with the above-described Formulas 1 and 2, the following Formula 5 can be derived.

$$\xi = \frac{K}{2 \times \omega_n} = \frac{K}{2 \times \sqrt{K \times a}} = \frac{1}{2}\sqrt{\frac{a}{K}} \quad \omega = \sqrt{K \times a} \quad \text{[Formula 5]}$$

In other words, a steady feedback loop can be obtained by appropriately selecting "K" and "a".

With the optical disk apparatus 1 according to the above-described embodiment of the present invention, a feedback loop can be formed in which its input signal from the VCO 14 is a value obtained by adding integration results of phase difference signals in periods corresponding to the writing reference clock signals to be generated and the multiplication results obtained by multiplying the phase difference signals with a predetermined value. Thereby, a steady DPLL circuit can be provided as the control loop.

With the optical disk apparatus 1 according to the above-described embodiment of the present invention, the dividing coefficient Kloop used when integrating the phase difference signal corresponding to the periods of the writing reference clock signals and/or the predetermined value Ksys for multiplying the phase difference signals can be changed. Therefore, a suitable loop bandwidth can be set such as in a case where low loop bandwidth is desired or a case where a relatively high loop bandwidth is desired. Hence, the DPLL circuit having satisfactory characteristics can be provided.

Since a loop bandwidth can be suitably set, it is advantageous particularly for an optical disk apparatus. For example, in a case of performing an actual writing operation, the loop bandwidth of the optical disk apparatus can be set low for preventing deterioration of writing quality due to jitter from change of frequency of the writing reference clock. signal. In another case, the loop bandwidth can be set relatively high for promptly locking to the wobble signal Wb and also fro preventing lock from being dislocated by disturbance in a case where the writing operation is not performed.

Further, the present invention is not limited to these embodiments, but variations and modifications may be made without departing from the scope of the present invention.

The present application is based on Japanese Priority Application No. 2006-007462 filed on Jan. 16, 2006, with the Japanese Patent Office, the entire contents of which are hereby incorporated by reference.

What is claimed is:

1. An optical disk apparatus comprising:
   a binarizing circuit part for outputting a reference digital signal; and
   a digital PLL circuit part for outputting a write timing signal based on the reference digital signal, the write timing signal indicating a timing synchronizing with a digital clock signal having a predetermined frequency;
   wherein the digital PLL circuit part includes
      an edge detection circuit part for detecting a rise edge and a fall edge of the reference digital signal in time resolution units in which a single period of a reference clock signal is divided into N (N where is no less than 2) intervals and outputting an edge detection signal for each the single period in accordance with the detection result, a digital clock data generating part for generating digital clock data in accordance with a phase difference indicated in an input phase difference signal in each the single period, and a phase difference detection circuit part for detecting a phase difference between the reference digital clock signal and the digital clock signal and outputting the phase difference signal indicating the detected phase difference.

2. The optical disk apparatus as claimed in claim 1, wherein the edge detection circuit part includes, a sampling circuit part for sampling the reference digital signal with N phase clock signals of different phases in the time resolution units, a bit data addition circuit part adding each bit data item in a N bit data set obtained from the sampling in each the single period and outputting bit addition data indicating the addition results, and a zero-crossing detecting circuit part for detecting a zero-crossing point of bit addition data signals including the bit addition data in the time resolution units and outputting the detection results as the edge detection signal in each the single period.

3. The optical disk apparatus as claimed in claim 2, wherein the zero-crossing detecting circuit part includes, a digital filter for allowing only the bit addition data signals having a predetermined frequency bandwidth to pass therethrough, and a zero-crossing detecting circuit for detecting the zero-crossing point of the bit addition data signals passed through the digital filter.

4. The optical disk apparatus as claimed in claim 1, further comprising:

a frequency difference detection circuit part for detecting a frequency difference between the digital clock signal and the reference digital clock signal according to the write timing signal and the reference digital signal and outputting a frequency difference signal indicating the detection results; and a first selecting circuit part into which the phase difference signal and the frequency difference signal are input for exclusively outputting the phase difference signal or the frequency difference signal to the clock data generating part in accordance with a first control signal input from outside;

wherein the edge detection circuit part includes an edge determining circuit part for determining the rise edge or the fall edge of the reference digital signal and outputting an edge determination signal indicating the determination results.

5. The optical disk apparatus as claimed in claim 4, further comprising:

a gain adjusting circuit part for adjusting the gain of the phase difference signal or the frequency difference signal output from the first selecting circuit part and outputting a gain adjustment signal indicating the adjustment results;

an integration circuit part for integrating the gain adjustment signal in periods proportional to periods of the digital clock signal in accordance with the write timing signal and outputting an integration signal indicating the integration results; and a first addition circuit part for adding the gain adjustment signal and the integration signal and outputting an addition signal indicating the addition results to the clock data generating circuit part.

6. The optical disk apparatus as claimed in claim 5, wherein the integration circuit part includes, a counter for counting the number of rise edges or fall edges of the digital clock signal based on an edge position signal, a comparison circuit part for comparing the counted value of the counter and a predetermined value and resetting the counter when the counted value is equal to the predetermined value, and a second addition circuit part for adding an output signal and the gain adjustment signal whenever the counted value is equal to the predetermined value and outputting the addition results as the integration signal.

7. The optical disk apparatus as claimed in claim 6, wherein the integration circuit part further includes, a second selecting circuit part for selecting one of the gain adjustment signal or a first predetermined signal input from outside in accordance with a second control signal input from outside and outputting the selected signal.

8. A digital PLL circuit for outputting a write timing signal based on an input reference digital signal, the write timing signal indicating a timing synchronizing with a digital clock signal having a predetermined frequency, the digital PLL circuit comprising:

an edge detection circuit part for detecting a rise edge and a fall edge of the reference digital signal in time resolution units in which a single period of a reference clock signal is divided into N (N where is no less than 2) intervals and outputting an edge detection signal for each the single period in accordance with the detection result;

a digital clock data generating part for generating digital clock data in accordance with a phase difference indicated in an input phase difference signal in each the single period; and a phase difference detection circuit part for detecting a phase difference between the reference digital clock signal and the digital clock signal and outputting the phase difference signal indicating the detected phase difference;

wherein the edge detection circuit part includes a sampling circuit part for sampling the reference digital signal with N phase clock signals of different phases in the time resolution units, a bit data addition circuit part adding each bit data item in a N bit data set obtained from the sampling in each the single period and outputting bit addition data indicating the addition results, and a zero-crossing detecting circuit part for detecting a zero-crossing point of bit addition data signals including the bit addition data in the time resolution units and outputting the detection results as the edge detection signal in each the single period.

9. The digital PLL circuit as claimed in claim 8, wherein the zero-crossing detecting circuit part includes, a digital filter for allowing only the bit addition data signals having a predetermined frequency bandwidth to pass therethrough, and a zero-crossing detecting circuit for detecting the zero-crossing point of the bit addition data signals passed through the digital filter.

10. The digital PLL circuit as claimed in claim 8, wherein the clock data generating circuit part includes, N multiplying circuits for multiplying values 1 through N to corresponding phase differences indicated in the phase difference signals, N first data storing circuits for storing input digital data for each the single period, detecting the number of times of overflow of the digital data, and outputting overflow signals indicating the detection results, N first addition circuits for adding a digital data item stored in one of the N first data storing circuits with a digital data item output from a corresponding multiplying circuit and outputting the addition result to the corresponding first addition circuit, a second data storing circuit for storing digital data input in each the single period, and N second addition circuits for adding the digital data indicated in the overflow signal and the digital data stored in the second data storing circuit and outputting the addition results as the digital clock data.

11. The digital PLL circuit as claimed in claim 10, wherein the N second addition circuits are configured to output the N digital clock data in time resolution units within the single period to the phase difference detection circuit part, wherein the phase difference circuit part includes, a first selecting circuit part for selecting a digital clock data item among the N digital clock data in correspondence with the timing where the rise edge or the fall edge of the reference digital signal is detected from the edge detection signal and outputting the selected digital clock data item, and a phase difference signal generating circuit part for detecting phase difference between the reference digital signal and the digital clock signal from the digital clock data item output from the first selecting circuit part.

12. The digital PLL circuit as claimed in claim 8, wherein the clock data generating circuit part is configured to generate edge position signal in each the single period in accordance with each of the digital clock data, the edge position signal indicating whether there is a rise edge or a fall edge of the digital clock signal in time resolution units.

13. The digital PLL circuit as claimed in claim 12, further comprising:

a frequency difference detection circuit part for detecting a frequency difference between the digital clock signal and the reference digital clock signal and outputting a frequency difference signal indicating the detection results;

a second selecting circuit part into which the phase difference signal and the frequency difference signal are input for exclusively outputting the phase difference signal or the frequency difference signal to the clock data generating part in accordance with a first control signal input from outside;

wherein the edge detection circuit part includes an edge determining circuit part for determining the rise edge or the fall edge of the reference digital signal and outputting an edge determination signal indicating the determination results.

14. The digital PLL circuit as claimed in claim 13, wherein the frequency difference detection circuit part includes, a first counter for counting the number of rise edges or fall edges of the reference digital signal, a second counter for counting the number of rise edges or fall edges of the digital clock signal from the edge position signal until the counted value counted by the first counter reaches a first predetermined value, a first comparison circuit part for comparing the counted value counted by the second counter and a second predetermined value, and a frequency difference signal generating circuit part for generating the frequency difference signal based on the comparison results of the first comparison circuit part and outputting the generated frequency difference signal.

15. The digital PLL circuit as claimed in claim 13, further comprising:

a gain adjusting circuit part for adjusting the gain of the phase difference signal or the frequency difference signal output from the second selecting circuit part and outputting a gain adjustment signal indicating the adjustment results;

an integration circuit part for integrating the gain adjustment signal in periods proportional to periods of the digital clock signal in accordance with the edge position signal and outputting an integration signal indicating the integration results; and a first addition circuit part for adding the gain adjustment signal and the integration signal and outputting an addition signal indicating the addition results to the clock data generating circuit part.

16. The digital PLL circuit as claimed in claim 15, wherein the integration circuit part includes, a third counter for counting the number of rise edges or fall edges of the digital clock signal based on the edge position signal, a second comparison circuit part for comparing the counted value of the third counter and a third predetermined value and resetting the third counter when the counted value of the third counter is equal to the third predetermined value, and a second addition circuit part for adding an output signal and the gain adjustment signal whenever the counted value of the third counter is equal to the third predetermined value and outputting the addition results as the integration signal.

17. The digital PLL circuit as claimed in claim 16, wherein the integration circuit part includes, a third selecting circuit part for selecting one of the gain adjustment signal or a first predetermined signal input from outside in accordance with a second control signal input from outside and outputting the selected signal.

18. The digital PLL circuit as claimed in claim 15, wherein the gain adjustment circuit part is configured to integrate a second predetermined signal input from outside with a signal output from the second selecting circuit part and output the integration results as the gain adjustment signal.

19. The digital PLL circuit as claimed in claim 13, further comprising:

a gate circuit part connected between the second selecting circuit part and the digital clock data generating circuit part for outputting the output signal of the second selecting circuit part to the digital clock data generating circuit part in accordance with a third control signal input from outside.

20. The digital PLL circuit as claimed in claim 12, further comprising:

a parallel-to-serial conversion circuit part using the N phase clock signals for generating serial clock signals from the write timing signals that are parallel.

* * * * *